US008234613B2

(12) United States Patent
Tabaru et al.

(10) Patent No.: US 8,234,613 B2
(45) Date of Patent: Jul. 31, 2012

(54) PROGRAM, DESIGN APPARATUS, AND DESIGN METHOD FOR DYNAMIC RECONFIGURABLE CIRCUIT

(75) Inventors: Tsuguchika Tabaru, Kawasaki (JP);
Ryuichi Ohzeki, Oyama (JP);
Katsumoto Nomimura, Oyama (JP);
Toshihiro Suzuki, Oyama (JP);
Kiyomitsu Katou, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 363 days.

(21) Appl. No.: 12/497,022

(22) Filed: Jul. 2, 2009

(65) Prior Publication Data
US 2010/0017776 A1 Jan. 21, 2010

(30) Foreign Application Priority Data

Jul. 15, 2008 (JP) ................................. 2008-184119

(51) Int. Cl.
*G06F 17/50* (2006.01)
(52) U.S. Cl. ......................... 716/121; 716/124; 716/132
(58) Field of Classification Search ........................ None
See application file for complete search history.

(56) References Cited

U.S. PATENT DOCUMENTS 7,073,159 B2* 7/2006 Tsai et al. ..................... 716/112
7,904,848 B2* 3/2011 Coene et al. .................. 716/126
2002/0162097 A1 10/2002 Meribout
2005/0149890 A1* 7/2005 Tsai et al. ......................... 716/3
2005/0229139 A1* 10/2005 Tsai et al. ........................ 716/17
2006/0004940 A1 1/2006 Saito et al.
2006/0242385 A1 10/2006 Murakami et al.
2008/0288909 A1* 11/2008 Leijten-Nowak ............... 716/16

FOREIGN PATENT DOCUMENTS

| JP | 2002-123563 A | 4/2002 |
| JP | 2006-018514 A | 1/2006 |
| JP | 2006-185423 * | 7/2006 |

* cited by examiner

*Primary Examiner* — Leigh Garbowski
(74) *Attorney, Agent, or Firm* — Arent Fox LLP

(57) ABSTRACT

A computer-readable recording medium that stores therein a computer program for designing a dynamic reconfigurable circuit in which a plurality of circuit configurations are implemented with a single circuit, the computer program enabling a computer to execute: acquiring a plurality of contexts having connection information between operation devices and network modules, wherein the operation devices and network modules are disposed in clusters, and connection information among the network modules; calculating a cluster count of the clusters and an operation device count for each operation device type of the operation devices in each cluster based on the acquired plurality of contexts; generating a circuit configuration for each context in which disposition of the operation devices in each cluster and connection of the network modules are made to satisfy the calculated cluster count and operation device count; and outputting the generated circuit configuration.

15 Claims, 38 Drawing Sheets

| ELEMENT | THE NUMBER OF ELEMENTS |
|---|---|
| counter | 2 |
| add,sub | 2 |
| mul | 1 |
| acc | 1 |
| delay | 2 |
| RAM | 4 |

FIG. 6

```
def_virtual_config( 0 ){
  counter(0){ start = 0; end = 5; step = 1; condition = LT; interval = 0; stop = PASSIVE; }
  counter(1){ start = 0; end = 1000; step = 5; condition = LT; cascade = TRUE; }
  adder(0){ operation = ADD; signed = FALSE; }
  adder(1){ operation = SUB; signed = TRUE; }
  multiplier(0){ signed = TRUE; immediate = 0x5; }
  delay(0){ time = 3; }
  delay(1){ time = 2; }
  ram(0){ mode = READ_ONLY; }
  ram(1){ mode = READ_WRITE; } data_network(){
    adder(0).data_in_0 = counter(0).data_out_0;
    adder(0).data_in_1 = multiplier(0).data_in_0 = counter(1).data_out_0;
    delay(0).data_in_0 = ram(0).address_0 = adder(0).data_out_0;
    adder(1).data_in_0 = ram(0).data_out_0;
    delay(1).data_in_0 = multiplier(0).data_out_0;
    adder(1).data_in_1 = delay(1).data_out_0;
    ram(1).address_0 = delay(0).data_out_0;
    ram(1).data_in_0 = adder(1).data_out_0;
  } control_network(){
    counter(0).next = sequencer(0).start;
    counter(1).cascade_in = counter(0).cascade_out;
    sequencer(0).next = counter(0).stop = counter(1).cascade_out;
  }
} def_virtual_config( 1 ){
  counter(0){ start = 0; end = 1000; step = 1; condition = LT; interval = 0; }
  multiplier(0){ signed = TRUE; }
  accumulator(0){ operation = ADD; signed = TRUE; }
  delay(0){ time = 4; }
  ram(1){ mode = READ_ONLY; }
  ram(2){ mode = READ_ONLY; }
  ram(3){ mode = READ_WRITE; } data_network(){
    ram(1).address_0 = ram(2).address_0 = delay(0).data_in_0 = counter(0).data_out_0;
    multiplier(0).data_in_0 = ram(1).data_out_0;
    multiplier(0).data_in_1 = ram(2).data_out_0;
    accumulator(0).data_in_0 = multiplier(0).data_out_0;
    ram(3).address_0 = delay(0).data_out_0;
    ram(3).data_in_0 = accumulator(0).data_out_0;
  } control_network(){
    counter(0).next = sequencer(0).start;
    sequencer(0).next = counter(0).cascade_out;
  }
} def_virtual_sequence(){
  0 passive;
  1 passive;
}
```

| PE NAME | PROCESS TECHNOLOGY | ITEM | VALUE | UNIT |
|---|---|---|---|---|
| ADD | 90nm POWER SAVING | POWER | XXXX | $\mu W$ |
| | | AREA | XXXX | $\mu m^2$ |
| | | LATENCY | 1 | cycle |
| | 90nm HIGH SPEED | POWER | XXXX | $\mu W$ |
| | | AREA | XXXX | $\mu m^2$ |
| | | LATENCY | 1 | cycle |
| | COMMON | THE NUMBER OF DATA INPUT TERMINALS (di) | 2 | |
| | | THE NUMBER OF CONTROL SIGNAL INPUT TERMINALS (gi) | 1 | |
| | | THE NUMBER OF DATA OUTPUT TERMINALS (do) | 1 | |
| | | THE NUMBER OF CONTROL SIGNAL OUTPUT TERMINALS (co) | 1 | |
| | | THE NUMBER OF IMMEDIATE OPERANDS | 1 | |
| | | IMMEDIATE OPERAND | XXXX | |
| | | THE NUMBER OF OPERATIONS | 8 | |
| | | OPERATION 1 | do=di1+di2 | |
| | | OPERATION 2 | do=di1−di2 | |
| | | ... | ... | ... |
| counter | 90nm POWER SAVING | POWER | XXXX | $\mu W$ |
| | | AREA | XXXX | $\mu m^2$ |
| | ... | ... | ... | ... |

FIG. 8

| cluster | adder | multiplier | accumulator | delay | loop | register | RAM | control |
|---|---|---|---|---|---|---|---|---|
| 0 | 2 | 1 | 1 | 6 | 3 | 1 | 2 | 3 |
| 1 | 2 | 1 | 1 | 6 | 3 | 3 | 2 | 1 |
| 2 | 4 | 2 | 1 | 6 | 0 | 1 | 2 | 3 |
| 3 | 4 | 2 | 1 | 6 | 0 | 3 | 2 | 1 |
| 4 | 4 | 2 | 1 | 6 | 0 | 1 | 2 | 3 |
| 5 | 4 | 2 | 1 | 6 | 0 | 3 | 2 | 1 |
| 6 | 4 | 2 | 1 | 6 | 0 | 1 | 2 | 3 |
| 7 | 4 | 2 | 1 | 6 | 0 | 3 | 2 | 1 |

```
common( 0, -1, -1 ){
    prog( prog_name_0 ).config( 0 ).ram( 1 );
    prog( prog_name_0 ).config( 1 ).ram( 1 );
    prog( prog_name_1 ).config( 1 ).ram( 3 );
    prog( prog_name_1 ).config( 2 ).ram( 3 );
}
common( 1, 1, 2 ){
    prog( prog_name_1 ).config( 0 ).register( 1 );
    prog( prog_name_1 ).config( 1 ).register( 1 );
    prog( prog_name_1 ).config( 2 ).register( 1 );
}
exclusive( 0, -1, -1 ){
    prog( prog_name_0 ).config( 1 ).ram( 2 );
    prog( prog_name_1 ).config( 0 ).ram( 0 );
}
```

| cluster | adder | multiplier | accumulator | delay | loop | register | RAM | control |
|---------|-------|------------|-------------|-------|------|----------|-----|---------|
| CL0 | 2 | 1 | 0 | 6 | 3 | 1 | 2 | 3 |
| CL1 | 2 | 1 | 1 | 6 | 3 | 3 | 2 | 1 |
| CL2 | 4 | 2 | 1 | 6 | 0 | 1 | 2 | 3 |
| CL3 | 4 | 2 | 0 | 6 | 0 | 3 | 2 | 1 |
| CL4 | 4 | 2 | 0 | 6 | 0 | 1 | 2 | 3 |
| CL5 | 4 | 2 | 1 | 6 | 0 | 3 | 2 | 1 |
| CL6 | 4 | 2 | 1 | 6 | 0 | 1 | 2 | 3 |
| CL7 | 4 | 2 | 0 | 6 | 0 | 3 | 2 | 1 |

| CONTEXT | CLUSTER | PE | RESOURCE USAGE STATUS |
|---|---|---|---|
| CT0 | CL0 | adder | 1 / 2 |
| | | multiplier | 1 / 1 |
| | | accumulator | 0 / 0 |
| | | delay | 1 / 6 |
| | | counter | 2 / 3 |
| | | register | 0 / 1 |
| | | RAM | 1 / 2 |
| | | control | 0 / 3 |
| | CL1 | adder | 1 / 2 |
| | | multiplier | 0 / 1 |
| | | accumulator | 0 / 1 |
| | | delay | 1 / 6 |
| | | counter | 0 / 3 |
| | | register | 0 / 3 |
| | | RAM | 1 / 2 |
| | | control | 0 / 1 |
| CT1 | CL0 | adder | 0 / 2 |
| | | multiplier | 1 / 1 |
| | | accumulator | 0 / 0 |
| | | delay | 1 / 6 |
| | | counter | 1 / 3 |
| | | register | 0 / 1 |
| | | RAM | 2 / 2 |
| | | control | 0 / 3 |
| | CL1 | adder | 0 / 2 |
| | | multiplier | 0 / 1 |
| | | accumulator | 1 / 1 |
| | | delay | 0 / 6 |
| | | counter | 0 / 3 |
| | | register | 0 / 3 |
| | | RAM | 1 / 2 |
| | | control | 0 / 1 |

FIG. 12    ~508

```
def_config( 0 ) [
    counter(0) [ start = 0; end = 5; step = 1; condition = LT; interval = 0 ; stop = PASSIVE; ]
    counter(1) [ start = 0; end = 1000; step = 5; condition = LT; cascade = TRUE; ]
    adder(0) [ operation = ADD; signed = FALSE; ]
    multiplier(0) [ signed = TRUE; immediate = 0x5 ]
    ram(0) [ mode = READ_WRITE; ]

data_network () [
        adder(0).data_in_0 = counter(0).data_out_0;
        adder(0).data_in_1 = multiplier(0).data_in_0 = counter(1).data_out_0;
        adder(0).data_in_0 = ext_port(0).data_out_2; = adder(0).data_out_0;
        delay(0).data_in_0 = ext_port(0).data_out_3 = multiplier(0).data_out_0;
        ext_port(0).data_out_3 = multiplier(0).data_out_0;
        ram(0).address_0 = delay(0).data_out_0;
        ram(0).data_in_0 = ext_port(0).data_in_3;
    ]

control_network () [
        counter(0).next = sequencer(0).start ;
        counter(1).cascade_in = counter(0).cascade_out ;
        sequencer(0).next = counter(0).stop = counter(1).cascade_out ;
    ]
]

def_config( 1 ) [
    adder(0) [ operation = SUB; signed = TRUE; ]
    delay(0) [ time = 2; ]
    ram(0) [ mode = READ_ONLY; ]

data_network () [
        ram(0).address_0 = ext_port(0).data_in_7;
        adder(0).data_in_0 = ram(0).data_out_0;
        delay(0).data_in_0 = ext_port(0).data_in_6;
        adder(0).data_in_1 = delay(0).data_out_0;
        ext_port(0).data_out_6 = multiplier(0).data_out_0;
    ]

control_network () [
    ]
]

def_config( 2 ) [
    counter(0) [ start = 0; end = 1000; step = 1; condition = LT; interval = 0 ; ]
    multiplier(0) [ signed = TRUE; ]
    delay(0) [ time = 4; ]
    ram(0) [ mode = READ_ONLY; ]
    ram(1) [ mode = READ_ONLY; ]

data_network () [
        ram(0).address_0 = ram(1).address_0 = delay(0).data_in_0 = counter(1).data_out_0;
        multiplier(0).data_in_0 = ram(0).data_out_0;
        multiplier(0).data_in_1 = ram(1).data_out_0;
        ext_port(0).data_out_2 = multiplier(0).data_out_0;
        ext_port(0).data_out_3 = delay(0).data_out_0;
    ]

control_network () [
        counter(0).next = sequencer(0).start ;
        sequencer(0).next = counter(0).cascade_out ;
    ]
]

def_config( 3 ) [
    accumulator(0) [ operation = ADD; signed = TRUE; ]
    ram(1) [ mode = READ_WRITE; ]

data_network () [
        accumulator(0).data_in_0 = ext_port(0).data_in_7;
        ram(1).address_0 = ext_port(0).data_in 6;
        ram(1).data_in_0 = accumulator(0).data_in_0;
    ]

control_network () [
    ]
]

def_sequence( 0 ) [
    0, 1 passive;
    2, 3 passive;
]
```

FIG. 13

| CONTEXT | PE | PERFORMANCE | |
|---|---|---|---|
| CT0 | counter(0) | latency 9 | interval 0 |
| CT1 | counter(1) | latency 9 | interval 0 |

| PARAMETER CATEGORY | PARAMETER TYPE | VALUE |
|---|---|---|
| GENERAL | THE NUMBER OF ITERATIONS smax | 100000 |
| | SEED OF RANDOM NUMBER | 12345678 |
| TEMPERATURE | MAXIMUM Tf | 40000 |
| | MINIMUM Ti | 0.001 |
| | ATTENUATION PARAMETER l | 50000 |
| | THE NUMBER OF CYCLES BEFORE REHEATING R | 250000 |
| PE | GENERAL CONFIGURATION COST | 10000 |
| DATA NETWORK | MARGIN | 4 |
| | EXCEEDING COST | 10000 |
| CONTROL NETWORK | MARGIN | 4 |
| | EXCEEDING COST | 10000 |
| EXTERNAL INTERFACE | MARGIN | 2 |
| | EXCEEDING COST | 10000 |

FIG. 35

| cluster | adder | multiplier | accumulator | delay | loop | register | RAM | control |
|---|---|---|---|---|---|---|---|---|
| 0 | 1 | 1 | 0 | 1 | 2 | 0 | 2 | 0 |
| 1 | 1 | 0 | 1 | 1 | 0 | 0 | 2 | 0 |
| 2 | 0 | 0 | 0 | 0 | 0 | 0 | 0 | 0 |
| 3 | 0 | 0 | 0 | 0 | 0 | 0 | 0 | 0 |
| 4 | 0 | 0 | 0 | 0 | 0 | 0 | 0 | 0 |
| 5 | 0 | 0 | 0 | 0 | 0 | 0 | 0 | 0 |
| 6 | 0 | 0 | 0 | 0 | 0 | 0 | 0 | 0 |
| 7 | 0 | 0 | 0 | 0 | 0 | 0 | 0 | 0 |

FIG. 36

| cluster | adder | multiplier | accumulator | delay | loop | register | RAM | control |
|---|---|---|---|---|---|---|---|---|
| 0 | 1 | 0 | 1 | 5 | 1 | 1 | 0 | 3 |
| 1 | 1 | 1 | 0 | 5 | 3 | 3 | 0 | 1 |
| 2 | 4 | 2 | 1 | 6 | 0 | 1 | 2 | 3 |
| 3 | 4 | 2 | 1 | 6 | 0 | 3 | 2 | 1 |
| 4 | 4 | 2 | 1 | 6 | 0 | 1 | 2 | 3 |
| 5 | 4 | 2 | 1 | 6 | 0 | 3 | 2 | 1 |
| 6 | 4 | 2 | 1 | 6 | 0 | 1 | 2 | 3 |
| 7 | 4 | 2 | 1 | 6 | 0 | 3 | 2 | 1 |

FIG. 37

| cluster | 0 | 1 | 2 | 3 | 4 | 5 | 6 | 7 |
|---|---|---|---|---|---|---|---|---|
| adder | 1 | 1 | 16 | 16 | 16 | 16 | 16 | 16 |
| multiplier | 0 | 1 | 4 | 4 | 4 | 4 | 4 | 4 |
| accumulator | 1 | 0 | 1 | 1 | 1 | 1 | 1 | 1 |
| delay | 25 | 25 | 36 | 36 | 36 | 36 | 36 | 36 |
| loop | 1 | 9 | 0 | 0 | 0 | 0 | 0 | 0 |
| register | 1 | 9 | 1 | 9 | 1 | 9 | 1 | 9 |
| RAM | 0 | 0 | 4 | 4 | 4 | 4 | 4 | 4 |
| control | 9 | 1 | 9 | 1 | 9 | 1 | 9 | 1 |

PROGRAM, DESIGN APPARATUS, AND DESIGN METHOD FOR DYNAMIC RECONFIGURABLE CIRCUIT

CROSS-REFERENCE TO RELATED APPLICATIONS

This application is based upon and claims the benefit of priority from the prior Japanese Patent Application No. 2008-184119 filed on Jul. 15, 2008, the entire contents of which are incorporated herein by reference.

BACKGROUND

1. Field

The present invention relates to a design program, design apparatus, and design method for designing a dynamic reconfigurable circuit, in which a plurality of circuit configurations are implemented with a single circuit.

2. Description of Related Art

In recent years, reconfigurable circuits have been in practical use in which operation devices (processing elements, simply referred to as "PEs" hereinafter) that perform processes (e.g. calculation, selection, delay, etc.) are combined with a network that connects the PEs. Among reconfigurable circuits, circuits with large-scale PEs are called coarse-grained circuits. In a coarse-grained circuit, a set of information of operations of the PEs and connection information among the PEs and the network is called a context, which can be changed as needed.

Specifically, dynamic reconfigurable circuits are reconfigurable circuits capable of changing the context in about one clock. In a dynamic reconfigurable circuit, a plurality of circuit configurations can be implemented with a single electronic circuit by switching from one context to another.

Japanese Patent Laid-Open No. 2006-18514 describes an electronic Circuit that has units called clusters, each including a plurality of PEs, control systems and a network, in order to configure a part of the circuit dynamically and independently of the other parts.

SUMMARY

According to an aspect of the invention, a computer-readable recording medium that stores therein a computer program for designing a dynamic reconfigurable circuit in which a plurality of circuit configurations are implemented with a single circuit, the computer program enabling a computer to execute: acquiring a plurality of contexts having connection information between operation devices and network modules, wherein the operation devices and network modules are disposed in clusters, and connection information among the network modules, calculating a cluster count of the clusters and an operation device count for each operation device type of the operation devices in each cluster based on the acquired plurality of contexts, generating a circuit configuration for each context in which disposition of the operation devices in each cluster and connection of the network modules are made to satisfy the calculated cluster count and operation device count and outputting the generated circuit configuration.

The features and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is an illustrative diagram of exemplary logical assemblers;

FIG. 7 is an illustrative diagram of hardware element information;

FIG. 8 is an illustrative diagram of an exemplary general element configuration file;

FIG. 9 is an illustrative diagram of an exemplary sharing specification file for PEs;

FIG. 10 is an illustrative diagram of an element configuration definition file;

FIG. 11 is an illustrative diagram of resource usage status files;

FIG. 12 is an illustrative diagram of physical assemblers;

FIG. 13 is an illustrative diagram of performance reports;

FIG. 19 is an illustrative diagram of parameters used in an annealing method;

FIG. 35 is an illustrative diagram of a list that indicates the number of PEs of each PE type in each cluster in generated circuit configurations;

FIG. 36 is an illustrative diagram of a list that indicates the difference obtained by subtracting the number of PEs of each selected PE type in each cluster from the number of PEs of each selected PE type in the general element configuration file;

FIG. 37 is an illustrative diagram of a list that indicates an index value v for each PE type in each cluster in the generated circuit configurations.

DETAILED DESCRIPTION

With reference to the accompanying drawings, a preferred variation of the design program, design apparatus, and design method will be described below in detail. The working process of designing a dynamic reconfigurable circuit includes the following: (1) verification of logics to be mounted on the dynamic reconfigurable circuit, (2) designing of the dynamic reconfigurable circuit, (3) verification of connections in the dynamic reconfigurable circuit, (4) operational verification (simulation) of the dynamic reconfigurable circuit, (5) operational verification (simulation) of the dynamic reconfigurable circuit with programs mounted thereon, and (6) physical layout in combination with a CPU, IP, and the like.

If the programs are written in a high-level language, process (1) can be verified on a personal computer or the like. As for process (3) and (4), systems that automatically perform these simulations have been made. As for process (5), the operation is basically guaranteed. The variation simplifies or automates process (2). This allows the designing of the dynamic reconfigurable circuit to be facilitated, and the development period to be shortened.

(Overview of Dynamic Reconfigurable Circuit and Its Designing)

Now, the overview of the dynamic reconfigurable circuit and its designing according to aspects of the present invention will be described.

Figure 1:
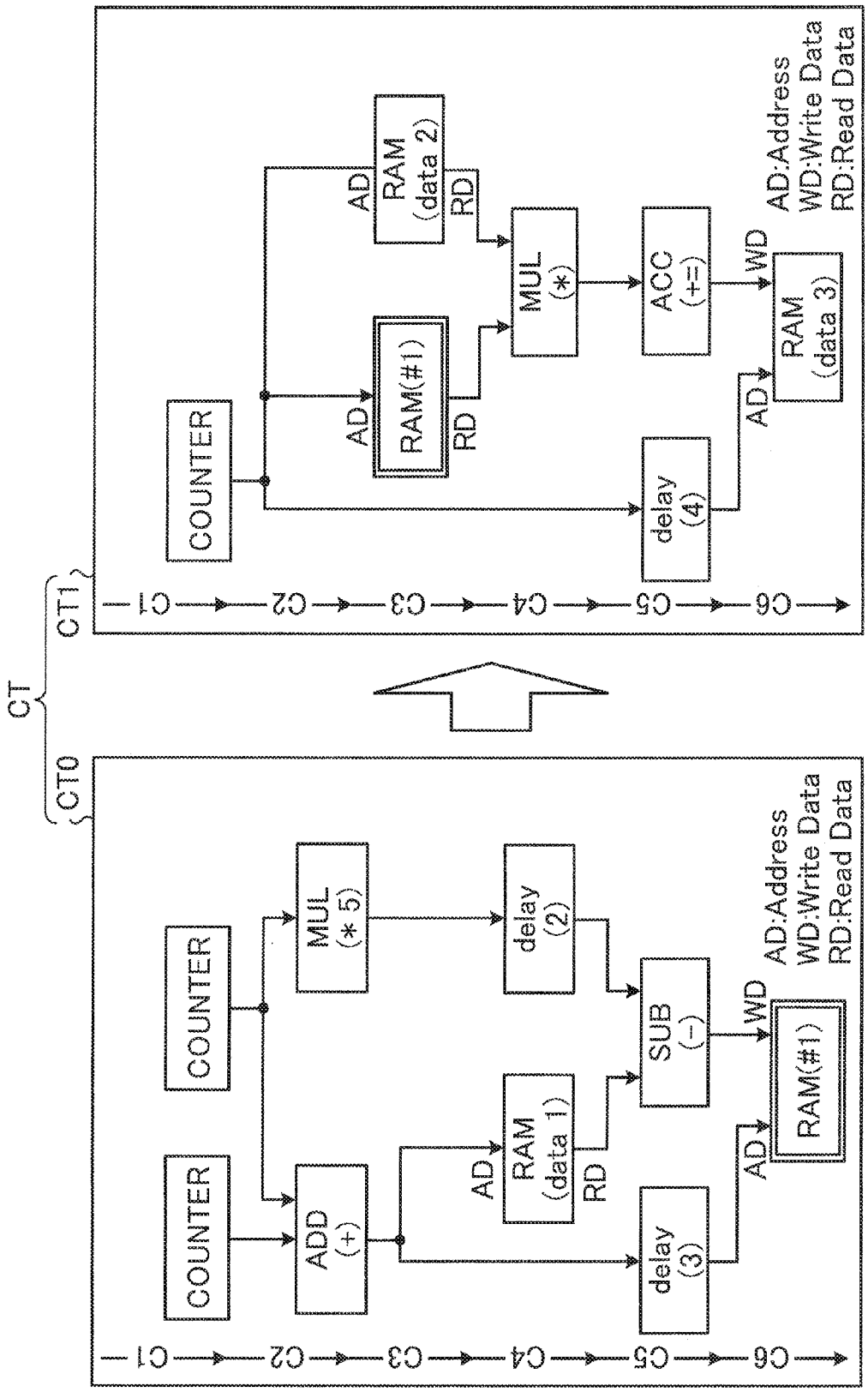
FIG. 1 is an illustrative diagram of contexts used in a dynamic reconfigurable circuit.

FIG. 1 is an illustrative diagram of contexts used in a dynamic reconfigurable circuit. The dynamic reconfigurable circuit has contexts CTs (CT0 and CT1). FIG. 1 illustrates that the context CT0 is switched to the context CT1. Blocks in each context CT represent PEs, whose types are indicated by labels (COUNTER, ADD, MUL, RAM, delay, SUB, and ACC) in the blocks.

Arrows between the PEs represent a data network. C# (# is a number) in the leftmost portion of each of the contexts CT0 and CT1 represents an execution cycle number. In FIG. 1, a control-flow network is not illustrated.

Figure 2:
FIG. 2 is an illustrative diagram of a PE information table.

FIG. 2 is an illustrative diagram of a PE information table. In the PE information table 200, each PE type is associated with the number of PEs of that type. The numbers of PEs of each type are illustrated in FIG. 2 are required to mount the context CT0 and the context CT1 on the dynamic reconfigurable circuit.

Figure 3:
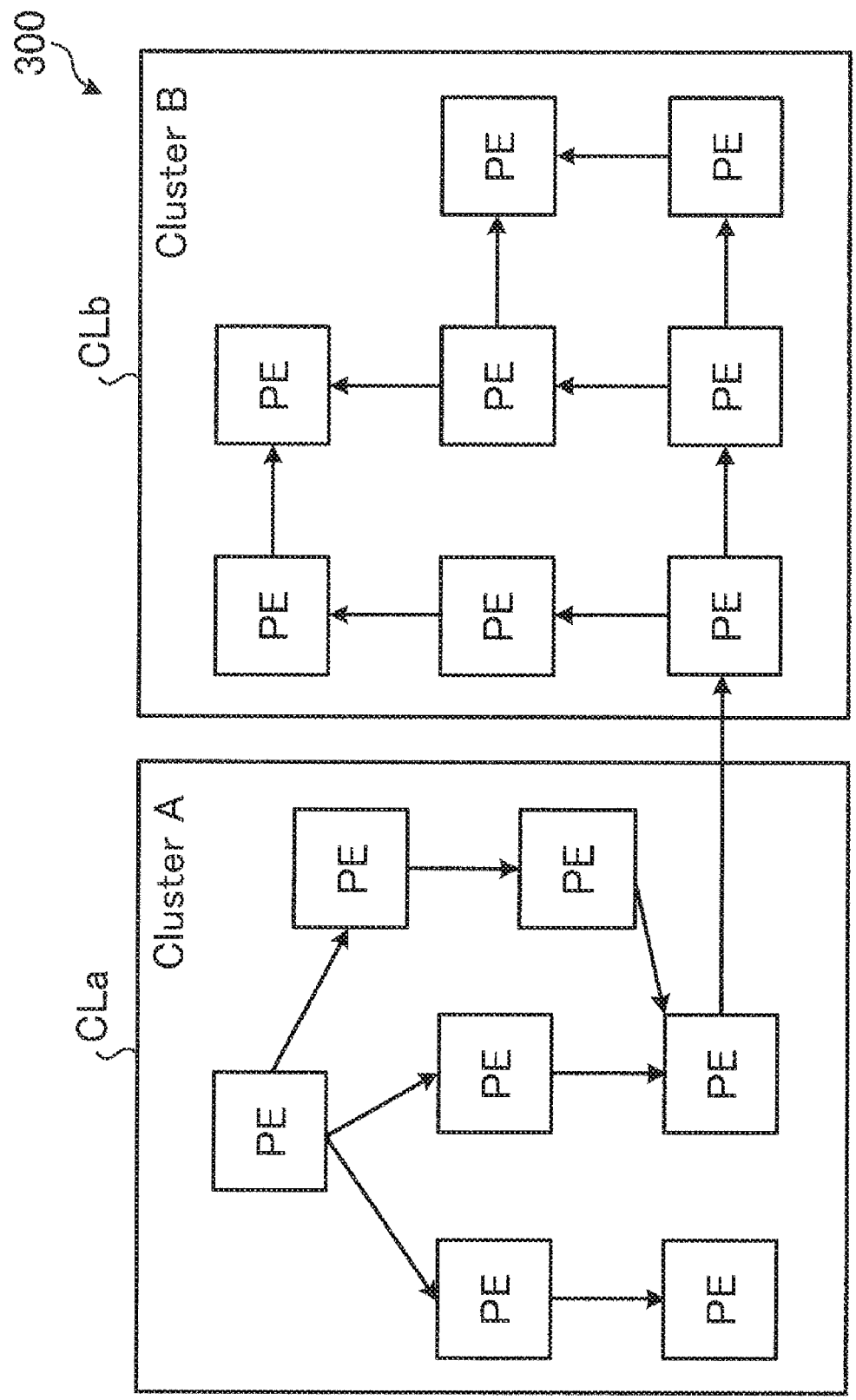
FIG. 3 is a conceptual diagram of a circuit implemented by the dynamic reconfigurable circuit.

FIG. 3 is a conceptual diagram of a circuit implemented by the dynamic reconfigurable circuit. The circuit 300 illustrated in FIG. 3 has a configuration in which a cluster CLa and a cluster CLb are connected with each other. In each of the clusters CLa and CLb, blocks represent PEs and arrows represent a network. In the clusters CLa and CLb, the network can freely connect the PEs.

Figure 4:
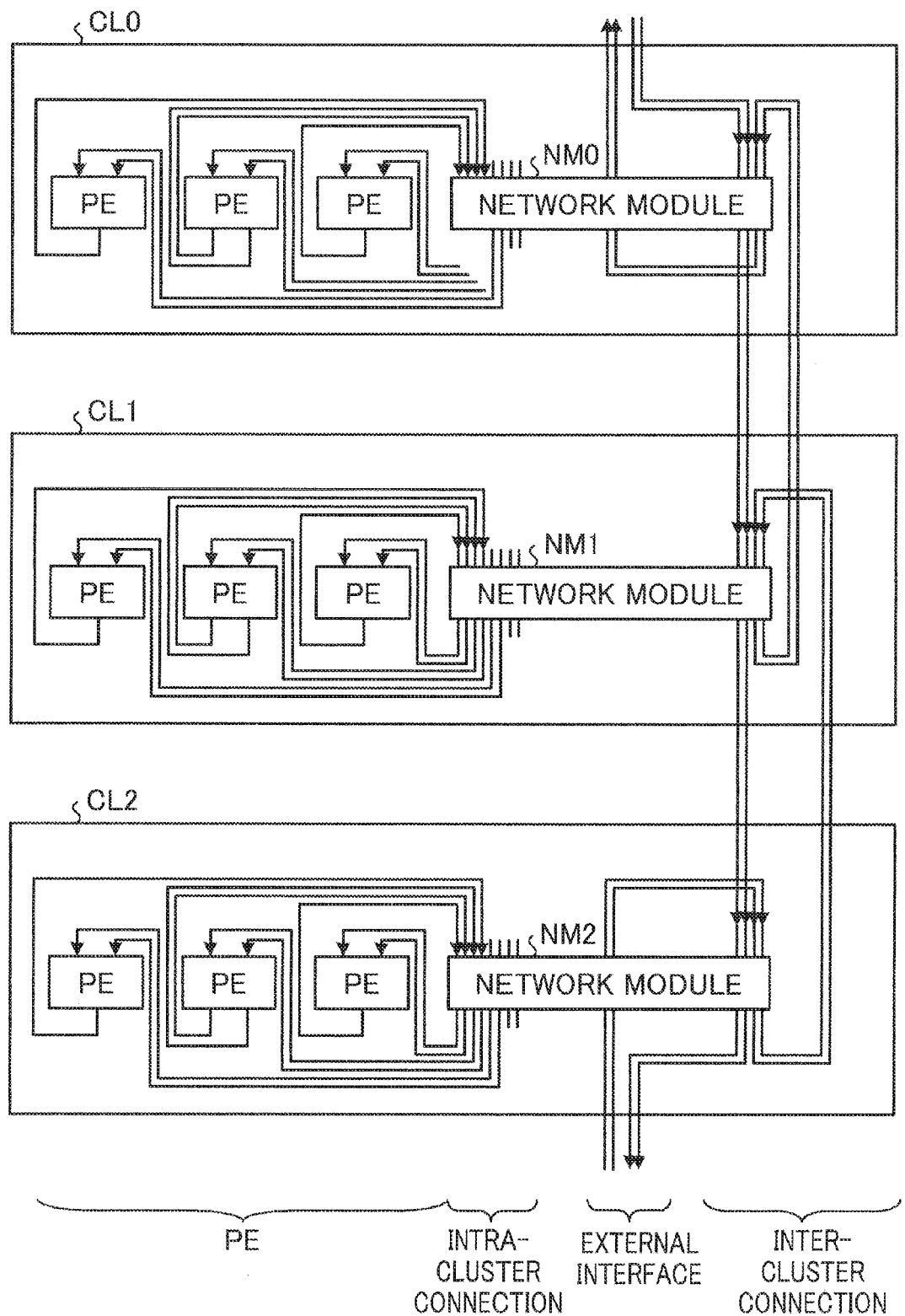
FIG. 4 is an illustrative diagram of a connection relationship between PEs and network modules.

FIG. 4 is an illustrative diagram of a connection relationship among PEs and network modules. Each cluster CL# (# is a number) is provided with PEs and a network module NM#. The PEs in each cluster CL# are connected with the network module NM# by intra-cluster connection, and the clusters CL# are connected with each other by inter-cluster connection. The cluster CL0 and the cluster CL2 are also connected with an external interface. By changing the PE types and the number of PEs of each type connected to the network modules NM#, a dynamic reconfigurable circuit that meets intended purposes can be created. The number of clusters is also changeable.

If the programs to be actually used are already known, the cost of the dynamic reconfigurable circuit can be reduced by composing a dynamic reconfigurable circuit that minimizes the circuit area, among ones that satisfy requirements such as the execution speed.

Therefore, in this illustrative variation, the dynamic reconfigurable circuit is designed by identifying necessary and sufficient numbers of PEs and clusters for realizing functions and performance to be actually used and by changing the number and layout of PEs and the number of clusters. However, predetermined circuits are used for the network modules, PEs, and control unit. In this manner, the signal timing is guaranteed, allowing the design process to be significantly automated and the circuit verification to be skipped. The period required for designing and verification can therefore be shortened.

In the design apparatus for the dynamic reconfigurable circuit according to this variation, determining the dynamic reconfigurable circuit requires a logical assembler or logical data flow for each context, along with conditions including tile area, the power consumption, and the number of execution cycles. If written in a high-level language, one or more programs are compiled with an appropriate compiler and thereby translated into logical assemblers that include one or more contexts, and the logical assemblers are input.

An assembler herein is a description representing the details of each context, the order in which the contexts are used, and hardware that executes the contexts. Depending on conditional branches and the like, a plurality of patterns is possible in the order in which the contexts are used. An assembler written on the assumption that all PEs in one context are included in one cluster is called a logical assembler.

(Input Information for Design Apparatus)

Figure 5:
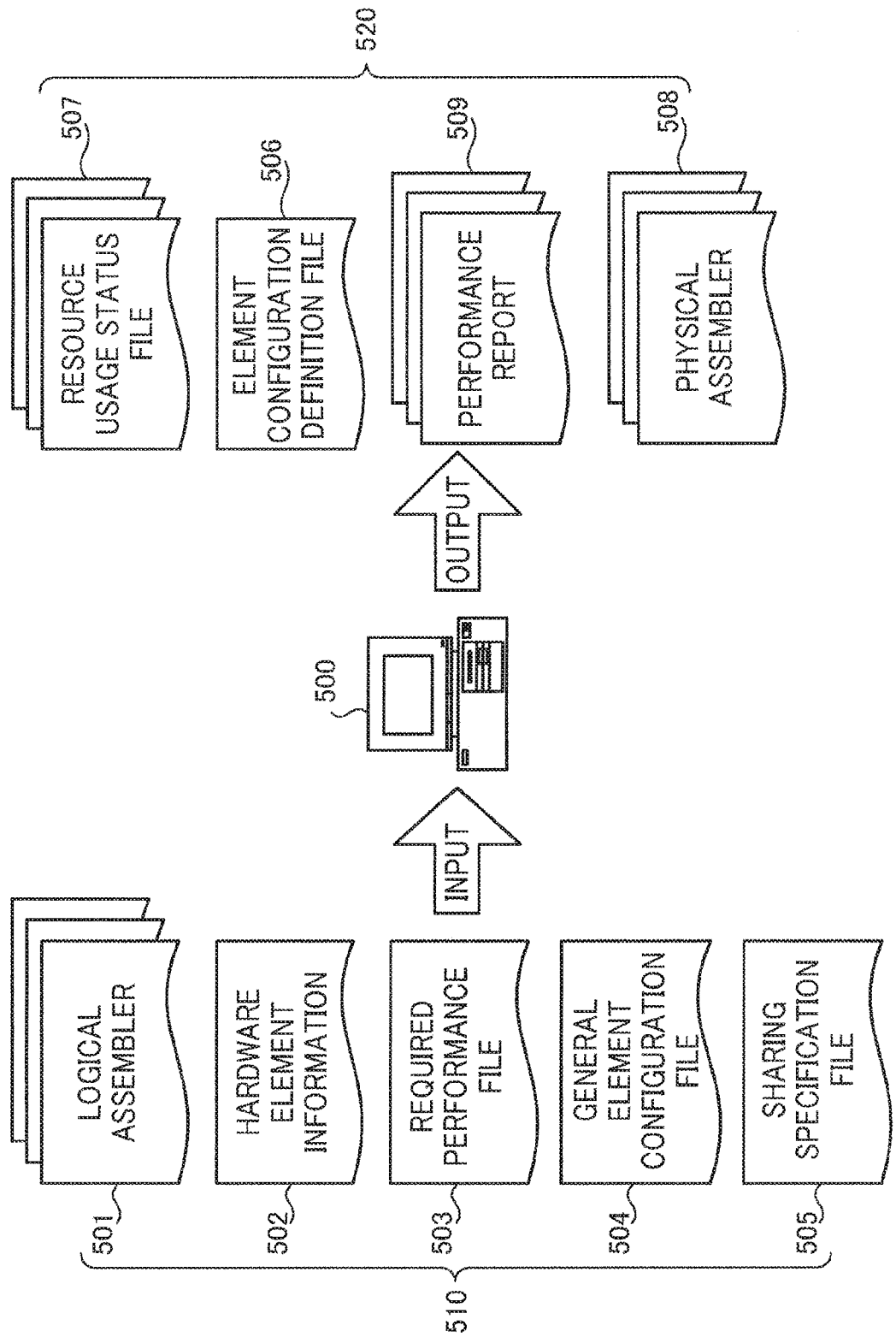
FIG. 5 is an illustrative diagram of input/output information for a design apparatus in accordance with aspects of the present invention.

FIG. 5 is an illustrative diagram of input/output information for the design apparatus. Logical assemblers 501, hardware element information 502, a required performance file 503, a general element configuration file 504, and a sharing specification file 505 are inputted as input information 510 to the design apparatus 500.

Since the logical assemblers 501 are assemblers written on the assumption that all PEs in one context are included in one cluster, the same number of logical assemblers 501 as clusters are inputted.

FIG. 6 is an illustrative diagram of exemplary logical assemblers 501. In the logical assemblers 501, "def_virtual_config( )" defines PEs disposed as a virtual configuration. For example, in "def_virtual_config(0)," "counter(0)" and "counter(1)" are defined as counters, "adder(0)" and "adder(1)" are defined as adders, "multiplier(0)" is defined as a multiplier, "delay(0)" and "delay(1)" are defined as delay devices, and "ram(0)" and "ram(1)" are defined as RAMs.

"data_network( )" represents a data network for the virtually disposed PEs. This approach allows for identifying which output of which PE is connected to an input of which PE. "Control_network( )" is a description of a control-flow network. In this example, details of control between counters and a sequencer are described. Thus, the logical assemblers 501 can also include the description of the control-flow network.

The logical assemblers 501 provide no hardware image because they do not include restrictions on the number of PEs and the like. Given the programs in a high-level language, the logical assemblers 501 are obtained by using a compiler and used as input. From the logical assemblers 501, PEs to be used can be known. From the logical assemblers 501 and a database, the area of the dynamic reconfigurable circuit to be designed can be roughly calculated. The logical assemblers 501 serve as the input information for the design apparatus 500 that designs the dynamic reconfigurable circuit.

FIG. 7 is an illustrative diagram of the hardware element information 502. The hardware element information 502 is hardware information necessary for compilation and performance estimation. In addition to information about the PEs, information about the inter-cluster networks, intra-cluster networks, and control unit is stored as the hardware element information 502. Taking the PEs as an example, process technologies, items, values (of the items), and units are stored for each PE. Calculating the power consumption of the dynamic reconfigurable circuit requires the number of used PEs and the operation rate. As the operation rate for this calculation, a value provided by a user beforehand is used, or if it is not specified by the user, a default value is assumed.

In some variations, if the processing speed is optimized, the processing is supposed to be pipelined. In this case, the number of processing cycles is the number of cycles allocated to one loop. The number of cycles depends on the number of accesses to the same RAM and the number of accesses simultaneously received by RAMs, if the processing is appropriately parallelized and pipelined. The number of cycles can be evaluated as the main performance. The total processing time it takes when the loop is passed through without iterations can be evaluated as another speed performance. In the logical assemblers 501, "interval=0" is set because each RAM is accessed once during the execution of the pipeline loop. The hardware element information 502 serves as the input information 510 for the design apparatus 500.

The required performance file 503 in FIG. 5 is a file that describes information about the performance required for the dynamic reconfigurable circuit to be designed. Exemplary performance information described includes the upper limit of the area of the dynamic reconfigurable circuit, and the number of execution cycles per iteration.

FIG. 8 is an illustrative diagram of an exemplary general element configuration file 504. In FIG. 8, the content of the general element configuration file 504 for hardware capable of accommodating up to eight clusters at the maximum is described. The leftmost column describes the cluster numbers. Other columns describe, from the left, the numbers of PEs for adders, multipliers, accumulators, delay devices, pipeline loop counters, registers, RAMs, and controls.

FIG. 9 is an illustrative diagram of an exemplary sharing specification file 505 for PEs. In this file, information about inter-context sharing within one program is generated by the compiler. Sharing of PEs among a plurality of programs and exclusive use of PEs are specified by the user to the compiler beforehand.

In FIG. 9, "common(0,−1,−1)" describes that contexts in programs "prog_name_0" and "prog_name_1" share a RAM, and it does not prohibit other programs from updating this RAM. The first argument "0" is a sharing-condition number, which is a unique number in the file. The two arguments "−1" indicate that the location is not specified.

"Common(1,1,2)" indicates that a register is shared among three contexts of the program "prog_name_1." It does not prohibit other programs from updating this register. The second argument "1" indicates a cluster 1, and the third argument "2" indicates that a second register is used.

"Exclusive(0,−1,−1)" indicates that contexts in the programs "prog_name_0" and "prog_name_1" share a RAM, and that other programs to be subjected to compilation and disposition/wiring at the same time should not change this RAM. The two arguments "−1" indicate that the location is not specified.

The design apparatus 500 outputs an element configuration definition file 506, resource usage status files 507, physical assemblers 508, and performance reports 509 as output information 520. The dynamic reconfigurable circuit is generated to include at least as many clusters and PEs as defined in the element configuration definition file 506. As the context is switched, the circuit is reconfigured to satisfy the physical assembler 508 and the resource usage status file 507 corresponding to the current context.

FIG. 10 is an illustrative diagram of the element configuration definition file 506. The element configuration definition file 506 includes the types of PEs and the number of PEs of each type included in each cluster of the circuit configurations generated by the design apparatus 500.

FIG. 11 is an illustrative diagram of the resource usage status files 507. The resource usage status files 507 indicate, for each context, the ratio of PEs to PEs used in clusters in that context. The denominator of the ratio represents the usage status of each PE, and the numerator is the number of PEs in the corresponding cluster in the element configuration definition file 506.

For example, the context CT0 includes the clusters CL0 and CL1, and "1/2" is indicated for adder in the cluster CL0. That is, while two adder can be disposed in the cluster CL0 at the maximum, one adder is disposed in the cluster CL0 of the context CT0.

FIG. 12 is an illustrative diagram of the physical assemblers 508. The physical assemblers 508 are descriptions representing the circuit configuration obtained from the design apparatus 500. The physical assemblers 508 are generated from the element disposition, wiring, and circuit configuration of each context evaluated in generating the circuit configurations.

FIG. 13 is an illustrative diagram of the performance reports 509. The performance reports 509 describe a parameter of the interval of each pipeline loop, and an overall latency generated for each context. These parameter and latency are obtained as a report of the execution speed for each physical assembler 508. Although not represented, the circuit area and the power consumption are also output as the performance reports 509.

(Hardware Configuration of Design Apparatus 500)

Figure 14:
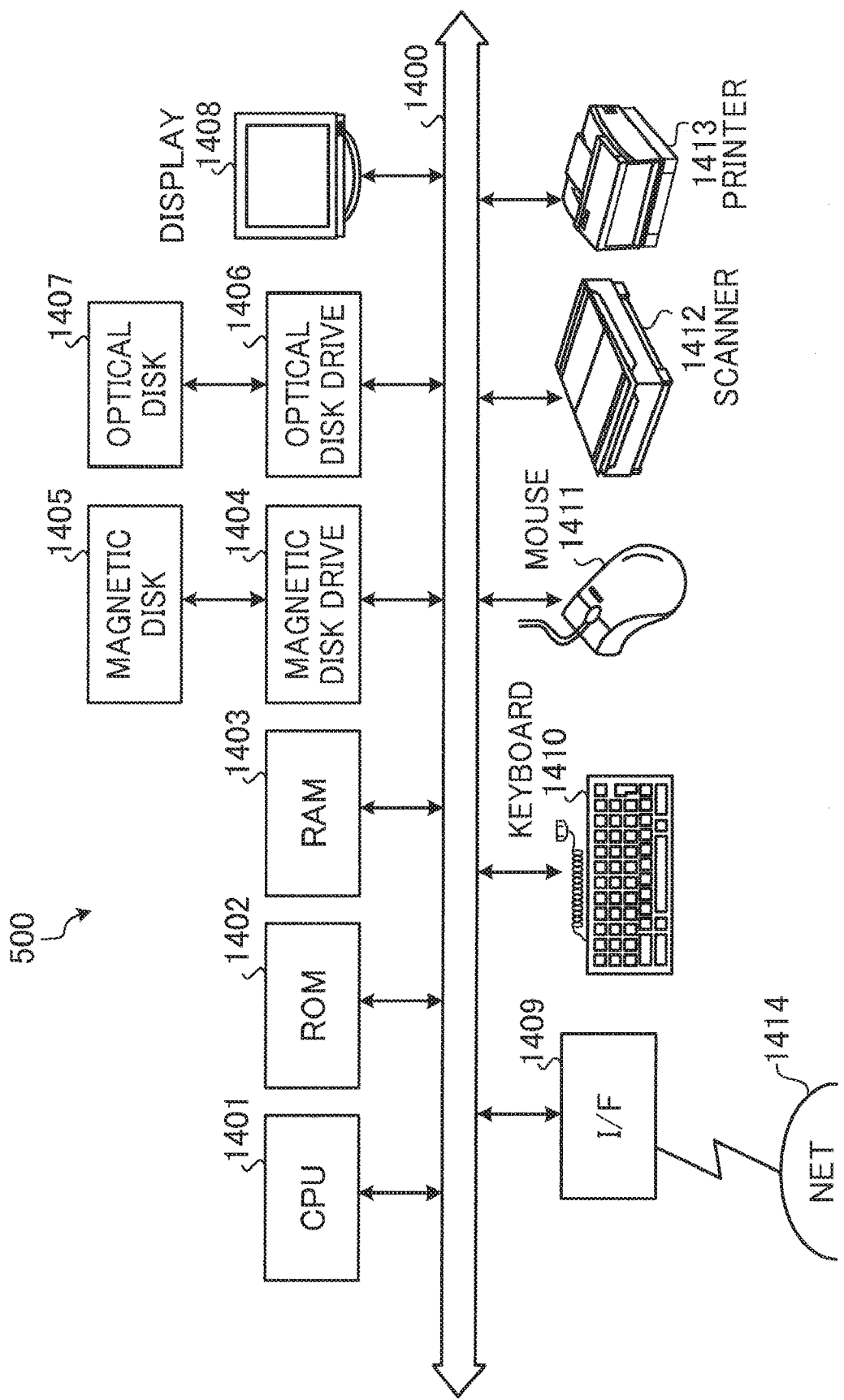
FIG. 14 is an illustrative diagram of a hardware configuration of the design apparatus.

FIG. 14 is an illustrative diagram of a hardware configuration of the design apparatus 500. In FIG. 14, the design apparatus 500 includes a CPU (Central Processing Unit) 1401, a ROM (Read-Only Memory) 1402, a RAM (Random Access Memory) 1403, a magnetic disk drive (hard disk drive) 1404, a magnetic disk 1405, an optical disk drive 1406, an optical disk 1407, a display 1408, an I/F (interface) 1409, a keyboard 1410, a mouse 1411, a scanner 1412, and a printer 1413. Each component is interconnected by a bus 1400.

The CPU 1401 is responsible for overall control of the design apparatus 500. The ROM 1402 stores various programs, such as a boot program. The RAM 1403 is used as a work area for the CPU 1401. The magnetic disk drive 1404 controls read/write of data from/to the magnetic disk 1405 under the control of the CPU 1401. The magnetic disk 1405 stores data written thereto under the control of the magnetic disk drive 1404.

The optical disk drive 1406 controls read/write of data from/to the optical disk 1407 under the control of the CPU 1401. The optical disk 1407 stores data written thereto under the control of the optical disk drive 1406 and causes the computer to read data stored on the optical disk 1407.

The display 1408 displays a cursor, an icon, or a toolbox, as well as data, such as documents, images, and functional information. A CRT, a TFT liquid crystal display, or a plasma display may be employed as the display 1408, for example.

The interface (abbreviated as "I/F" hereinafter) 1409 is connected to a network 1414 such as a LAN (Local Area Network), a WAN (Wide Area Network), or the Internet via a communication line, and connected to other apparatuses over the network 1414. The I/F 1409 is responsible for interfacing the network 1414 and the inside of the apparatus to control input/output of data from/to external apparatuses. A modem, a LAN adapter, or the like may be employed as the I/F 1409, for example.

The keyboard 1410 includes keys for inputting characters, numerals, various instructions, and the like, and inputs data. The keyboard 1410 may also be a touch-panel input pad or a ten-key pad. The mouse 1411 moves the cursor, selects an area, moves a window, changes the window size, and the like. The mouse 1411 may also be a track ball, a joystick, or the like, as long as it has similar functions as a pointing device.

The scanner 1412 optically reads an image and takes image data into the design apparatus 500. The scanner 1412 may be provided with an OCR (Optical Character Reader) function. The printer 1413 prints image data and document data. A laser printer or an ink-jet printer may be employed as the printer, for example.

(How to Determine Circuit Configuration)

Now, how to determine the circuit configuration will be described. Distributing PEs of a single context among clusters is roughly divided into the following three cases:

(a) The configuration of PEs in the clusters is predetermined, and no PEs can be added; (b) The configuration of PEs in the clusters is predetermined, but PEs can be added; and (c) PEs in the clusters are not determined at all, and the PEs in the context are distributed among the clusters while the configuration in the clusters is determined by freely adding PEs.

In case (a), the process involves mapping the context to existing PEs. Case (b) is similar to (a), but it is different in that PEs may be added when the PEs are not sufficient. In case (c), new PEs may be simply added. In each case, a simple and convenient method is an annealing method. Other possible methods include a method involving placing a long data flow so that it fits into one cluster, a method involving closely placing short data flows, a heuristic method, and the like. However, it is more difficult with such methods to find a configuration that satisfies conditions, compared to the annealing method. In addition, the operation of bringing the disposition to a balanced one is complicated in such methods.

By using these methods, the PEs are mounted on the clusters. If restrictions on the dynamic reconfigurable circuit and user requirements are both satisfied, the context distribution state is outputted. In cases (b) and (c), hardware configuration information is also output.

If the restrictions on the dynamic reconfigurable circuit are satisfied, but a disposition that satisfies the user requirements is not found, the context distribution state is outputted to notify the failure to satisfy the conditions. In cases (b) and (c), the hardware configuration information is also output. If a way of disposition that satisfies the restrictions on the dynamic reconfigurable circuit is not found, the design apparatus 500 notifies thereof. In this case, the user will make a modification, such as using further fine-grained context switching.

For implementing a plurality of contexts, if the process is in an LSI design stage, it is preferable that the contexts to be mounted are provided at a time such that the design apparatus 500 has an optimal PE disposition computed. There are two rough approaches for determining the PE disposition that simultaneously satisfies a plurality of contexts. In either case, if the PE disposition that satisfies network restrictions is not found, an error is output and the process terminates.

In a first approach, the design apparatus 500 first computes the minimum PE combination for mounting all the contexts from the result of logical compilation and estimates the number of required clusters. If a permissible area is already likely to be exceeded at this point, the user is notified thereof.

Then, the same number of clusters as determined above are prepared, and above method (c) is used to compute a configuration on which one context is mounted. Here, the disposition is performed to approach a balanced configuration. Considering the ease of later mounting, it is preferable to mount the largest context first. Except for the case of small contexts, the disposition is performed so that not too many PEs are mounted on any cluster and so that the inter-cluster networks fall within the restrictions.

Then, observing the restrictions on the inter-cluster networks and the intra-cluster networks, method (b) is used to mount the rest of the contexts, one by one. While several patterns are possible for the order in which the contexts are mounted, it is assumed here that the computation is performed in descending order of PE size. If the contexts are small, the number of clusters used for mounting is reduced to save power. If the contexts cannot be mounted by any means, a further attempt is made by increasing or decreasing the number of clusters to the extent appropriate.

A second approach is the simulated annealing method (simply referred to as the "annealing method" hereinafter). In this method, in addition to an approach similar to the above, method (c) can be used to mount all the contexts, so as to allow determination of the PE configuration, while evaluating the PE configuration at the same time. In either case, if the same PEs need to be used among the contexts, the disposition is made accordingly. This situation arises typically for PEs that hold data, such as RAMs and registers. In this case, the sharing specification file 505 is used to specify that the PEs be shared among the contexts. Hereinafter, the annealing method will be used to determine the circuit configuration.

After completion of the PE disposition, the timing is adjusted. Thereafter, the virtual PEs are replaced with physical PEs to determine the actual PE configuration. This operation is referred to herein as PE "realization." If an area, power, and the like are still available after the disposition, extra elements may be added, within a limit of the conditions to bring the PE configuration of each cluster closer to a balanced one, thereby increasing the generality. This operation is referred to herein as "generalization." The balanced configuration is provided by the general element configuration file 504. In the light of the foregoing, a design procedure of the design apparatus 500 will be described.

(Design Procedure of Design Apparatus 500)

Figure 15:
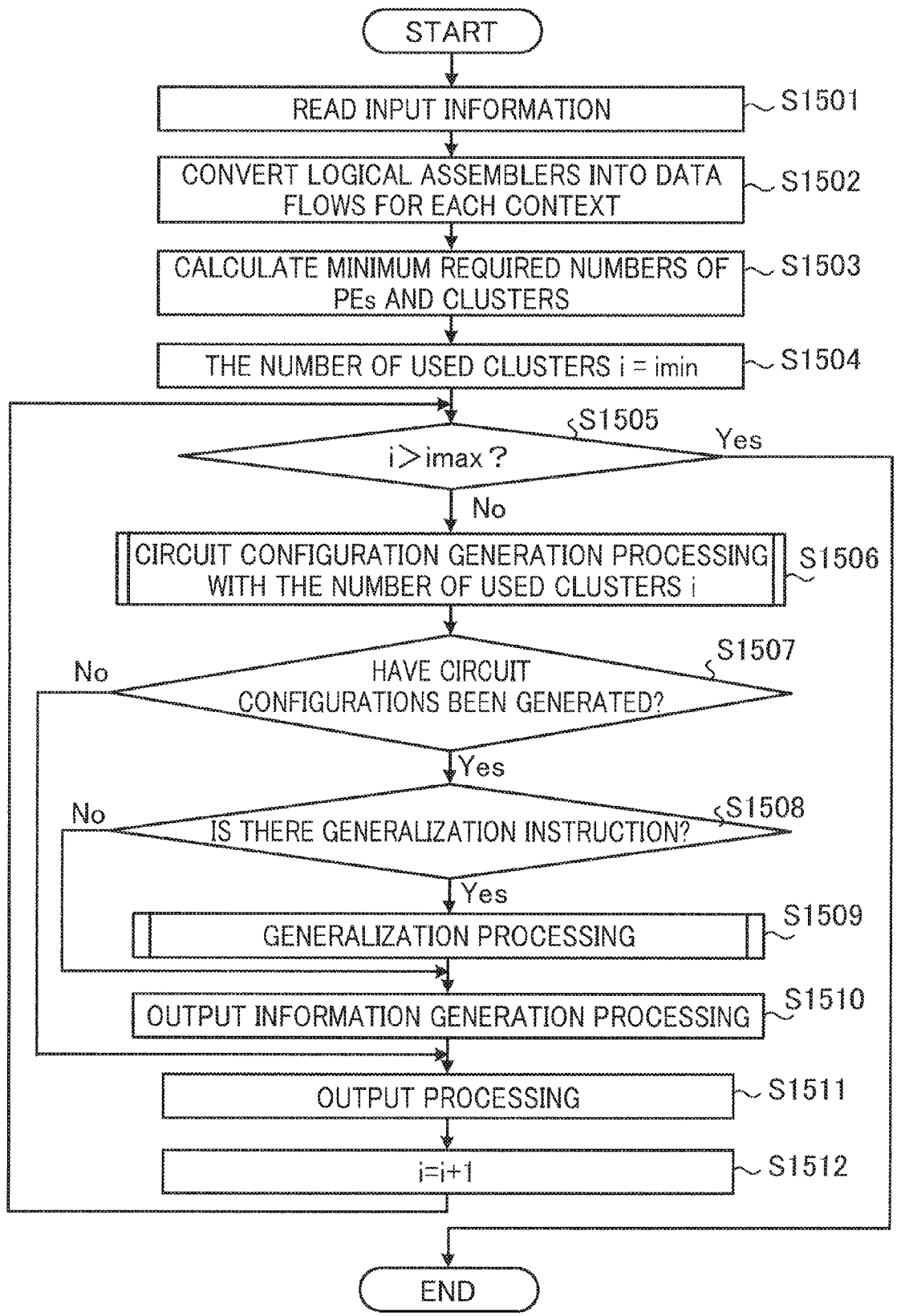
FIG. 15 is a flowchart of a design procedure of the design apparatus.

FIG. 15 is a flowchart of a design procedure of the design apparatus 500. In FIG. 15, the above-described input information 510 is read (step S1501), and the logical assemblers 501 in the input information 510 are converted into data flows for each context (step S1502). The minimum required numbers of PEs and clusters are calculated (step S1503).

Specifically, for example, the number of used PEs is counted for each type and for each context, and how many PEs at the maximum are used throughout the contexts is calculated for each PE type. If it is specified that the same PEs be exclusively used, the number of PEs is calculated to enable the exclusive use. From the resulting value and the number of input/output terminals in an intra-cluster network, the required number of clusters is calculated. More specifically, all the PEs are considered as models connected by the intra-cluster networks. The result of this calculation is output as the element configuration definition file 506.

Figure 16:
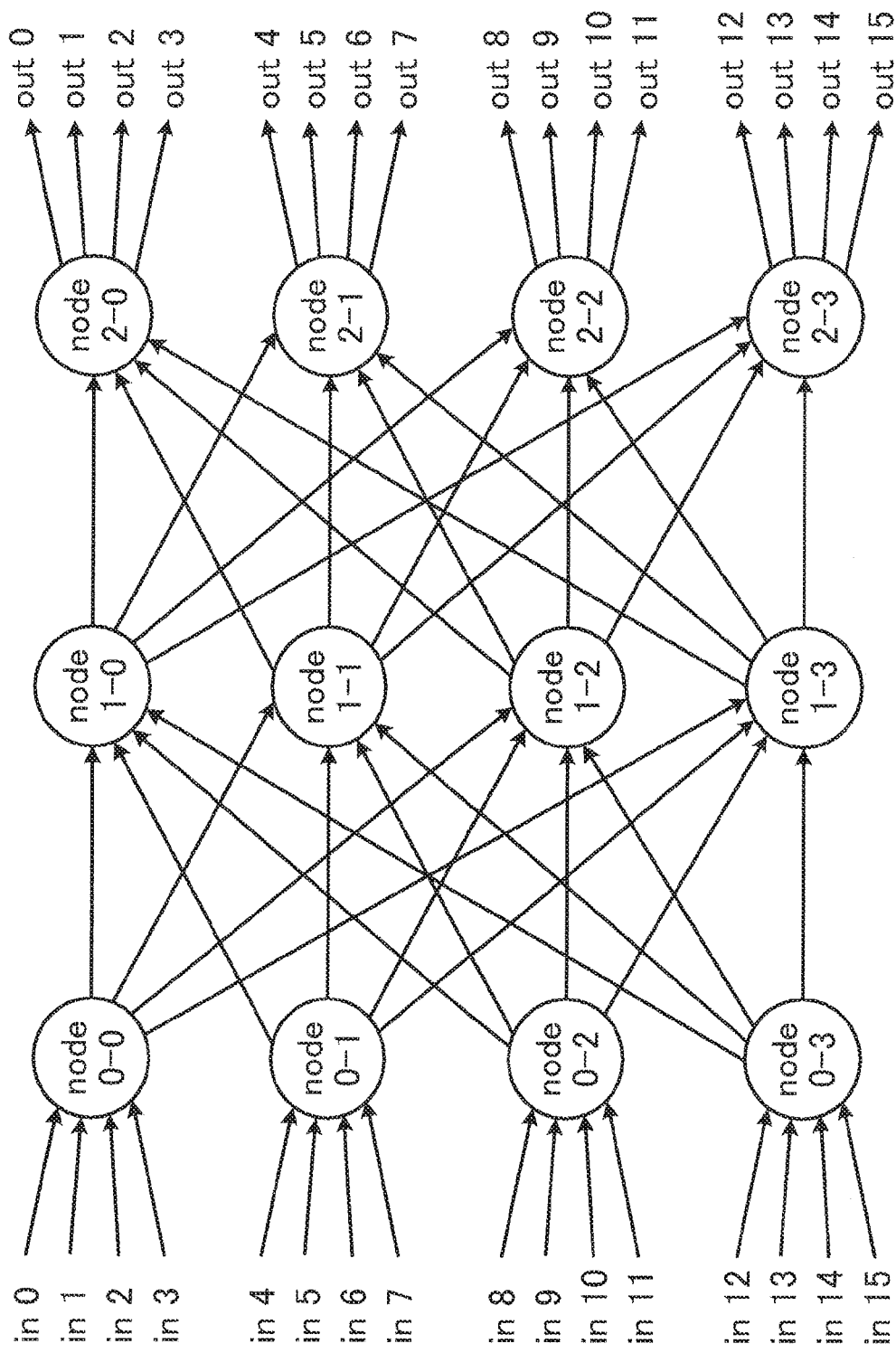
FIG. 16 is an illustrative diagram of an intra-cluster network.
Figure 17:
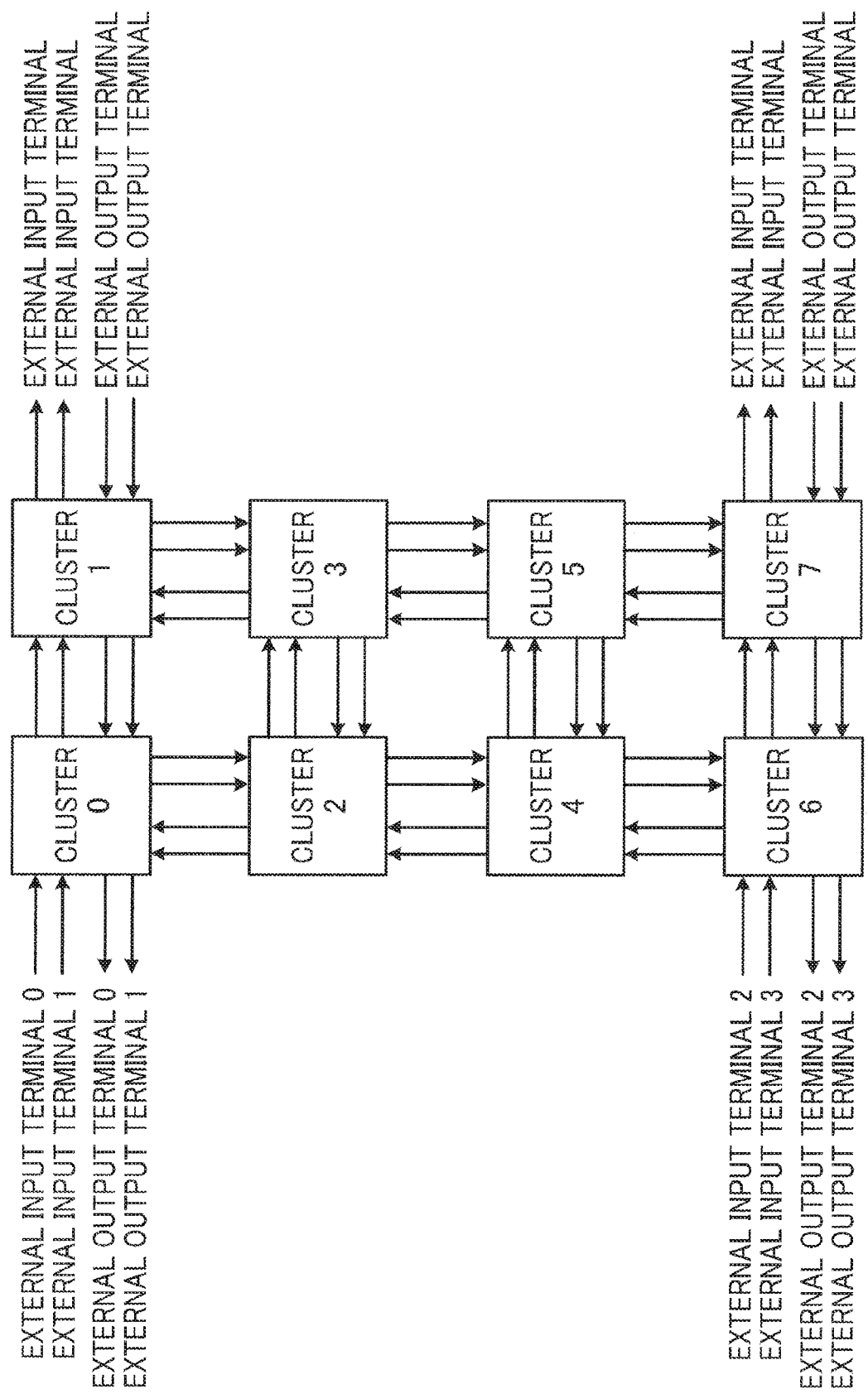
FIG. 17 is an illustrative diagram of inter-cluster networks.

FIG. 16 is an illustrative diagram of an intra-cluster network, and FIG. 17 is an illustrative diagram of inter-cluster networks. The PEs are connected to terminals, to which no inter-cluster network terminal is connected. In the examples of FIGS. 16 and 17, there are 56 input/output terminals per cluster.

The number of network terminals required for connecting all the PEs can be determined from the required PE types, the number of PEs of each type, and the network terminals of the PEs. The number of clusters that allows the terminals of all the PEs to connect to the networks is considered to be the minimum required number of clusters. For example, if 200 terminals are required for the PE input (network output) and 100 terminals are required for the PE output (network input), the minimum required number of clusters is four. That is, with four clusters, the PEs will have 4×56 (=224) terminals in total, which satisfies the requirement of 200 terminals for the PE input (network output) and 100 terminals for the PE output (network input).

Then in FIG. 15, the number of used clusters i is set as i=imin (step S1504), where imin is the minimum required number of clusters. It is determined whether or not i>imax (step S1505), where imax is the maximum number of clusters. If not i>imax (step S1505: No), circuit configuration generation processing with the number of used clusters i is performed (step S1506). It is then determined whether or not the circuit configurations have been generated (step S1507).

If the circuit configurations have been generated (step S1507: Yes), it is determined whether or not there is a generalization instruction (step S1508). Specifically, it is determined whether or not a generalization specification file has been read as the input information 510.

If there is a generalization instruction (step S1508: Yes), a generalization processing (step S1509) and output information generation processing (step S1510) are performed, and the process transitions to step S1511. The output information generation processing will be described further below. If there is no generalization instruction (step S1508: No), generalization processing is not performed, but output information generation processing is performed (step S1510), and the process transitions to step S1511.

If the circuit configurations have not been generated in step S1507 (step S1507: No), the process transitions to step S1511. In step S1511, the generated output information 520 is output (step S1511). Also, if the circuit configurations have not been generated in step S1507 (step S1507: No), an error is output. Then, i is incremented (step S1512), and the process returns to step S1505. In step S1505, if i>imax (step S1505: Yes), this sequential process terminates.

Although FIG. 15 illustrates that the process terminates if i>imax in step S1505 (step S1505: Yes), it is also possible that the process terminates upon returning to step S1505, after the circuit configurations have been generated in step S1507 (step S1507: Yes), and steps S1508 to S1512 have been performed.

Now, the above-mentioned output information generation processing (step S1510) will be described. In the output information generation processing, the element configuration definition file 506 is generated. The physical assemblers 508 are also generated from the element disposition, wiring, and circuit configuration of each context evaluated in generating the circuit configurations.

Further, from the physical assemblers 508, the parameter of the interval of each pipeline loop and the overall latency are generated for each context and are output as the report of the execution speed for each physical assembler 508. Information about used resources is also generated for each context and is output for each physical assembler 508. In addition, the circuit area and the power consumption are calculated as the output information 520.

The circuit area is calculated with the following expression (1).

$$s(c) = \sum_l (n_{PE}(c, l) \cdot s_{PE}(l, t)) + n_{Cl}(c) \cdot s_{Cl}(t) + n_{EN}(c) \cdot s_{EN}(t) \quad (1)$$

where s(c) is the area for the context c, nPE(c, l) is the number of used PEs of the type l for the context c, sPE(l, t) is the area per PE of the type l for a technology t, nCl(c) is the number of used clusters for the context c, sCl(t) is the total area of the control system and the intra-cluster network per cluster for the technology t, nEN(c) is the number of used inter-cluster networks for the context c, and sEN(t) is the area per inter-cluster network connection for the technology t.

The power consumption is calculated with the following expression (2).

$$p(c) = d \cdot \left\{ \sum_l (n_{PE}(c, l) \cdot p_{PE}(l, t)) + n_{Cl}(c) \cdot p_{Cl}(t) + n_{EN}(c) \cdot p_{EN}(t) \right\} \quad (2)$$

While the area is represented by s in the above expression (1), the power consumption is now represented by p. That is, p(c) is the power consumption for the context c. nPE(c, l) is the number of used PEs of the type l for the context c. pPE(l, t) is the power consumption per PE of the type l for a technology t. nCl(c) is the number of used clusters for the context c.

pCl(t) is the total power consumption of the control system and the intra-cluster network per cluster for the technology t. nEN(c) is the number of used inter-cluster networks for the context c. pEN(t) is the power consumption per inter-cluster network connection for the technology t. d is the operation rate of the circuit.

Now, a detailed procedure for circuit configuration generation processing (step S1506) will be described. Here, a circuit configuration generation processing to which the annealing method is applied will be described.

(Detailed Procedure of Circuit Configuration Generation Processing)

Figure 18:
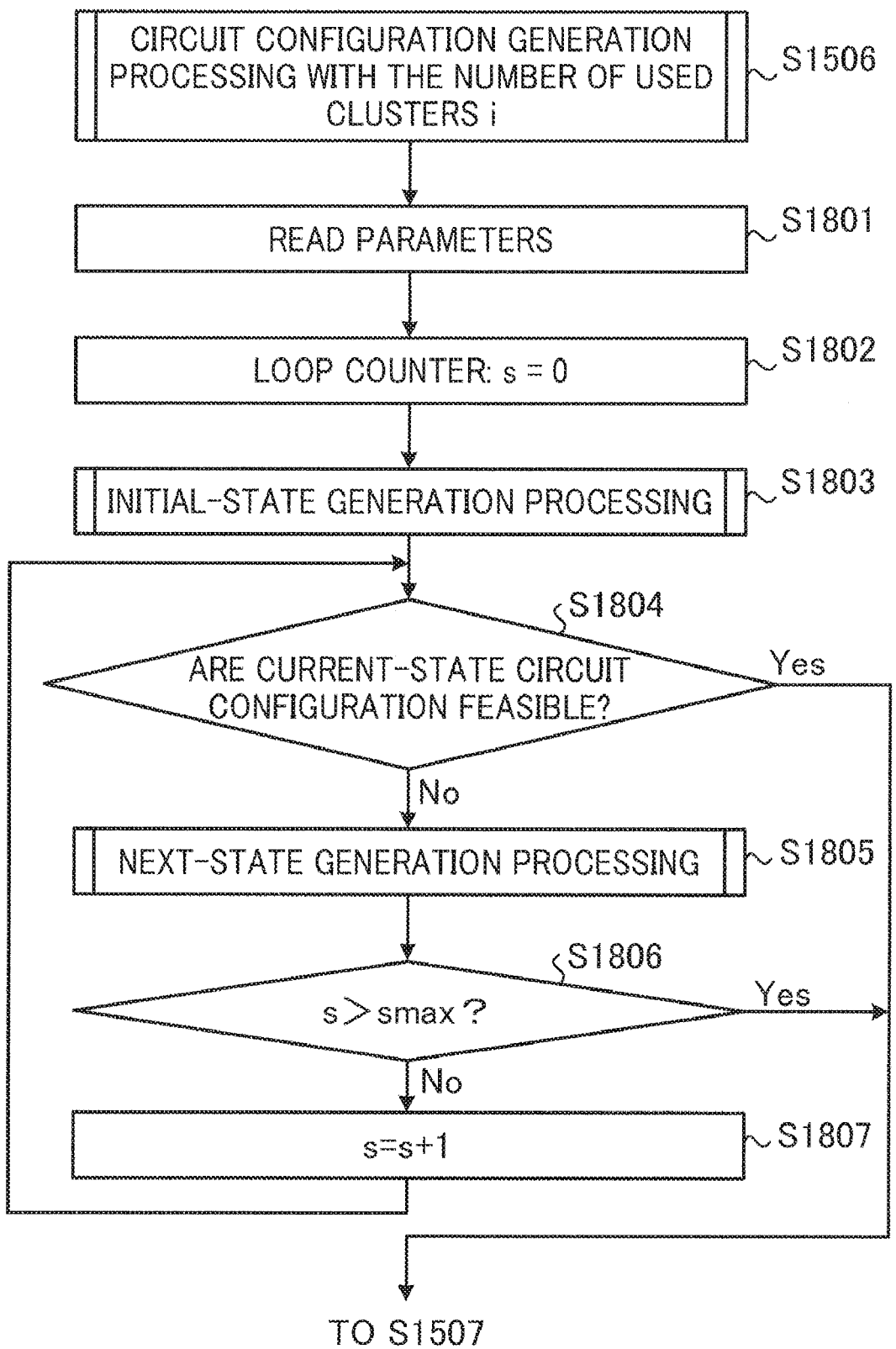
FIG. 18 is a flowchart of a detailed procedure of circuit configuration generation processing.

FIG. 18 is a flowchart of the detailed procedure for circuit configuration generation processing. First, parameters used in the annealing method are read (step S1801). FIG. 19 is an illustrative diagram of the parameters used in the annealing method. In addition, the PE information table 200 is illustrated in FIG. 2 and the general element configuration file 504 illustrated in FIG. 8 are read. A loop counter s is set as s=0 (step S1802), and initial-state generation processing is performed (step S1803). The initial state generation processing (step S1803) will be described further below.

Thereafter, it is determined whether or not the circuit configurations in the current state are feasible (step S1804). Specifically, for example, this determination is made by checking against the hardware element information 502 to see whether or not the PE configuration in the clusters satisfies constraints such as the number of input/output terminals. If the constraints are satisfied, it is determined that the circuit configurations in the current state are feasible.

If the circuit configurations are feasible (step S1804: Yes), the process transitions to step S1507. If the circuit configurations are not feasible (step S1804: No), next-state generation processing is performed (step S1805). The next-state generation processing (step S1805) will be described further below.

Thereafter, it is determined whether or not s>smax (step S1806), where smax is the number of iterations illustrated in FIG. 19. If not s>smax (step S1806: No), the loop counter s is incremented (step S1807), and the process returns to step S1804. If s>smax (step S1806: Yes), the process transitions to step S1507.

(Detailed Procedure of Initial-State Generation Processing)

Figure 20:
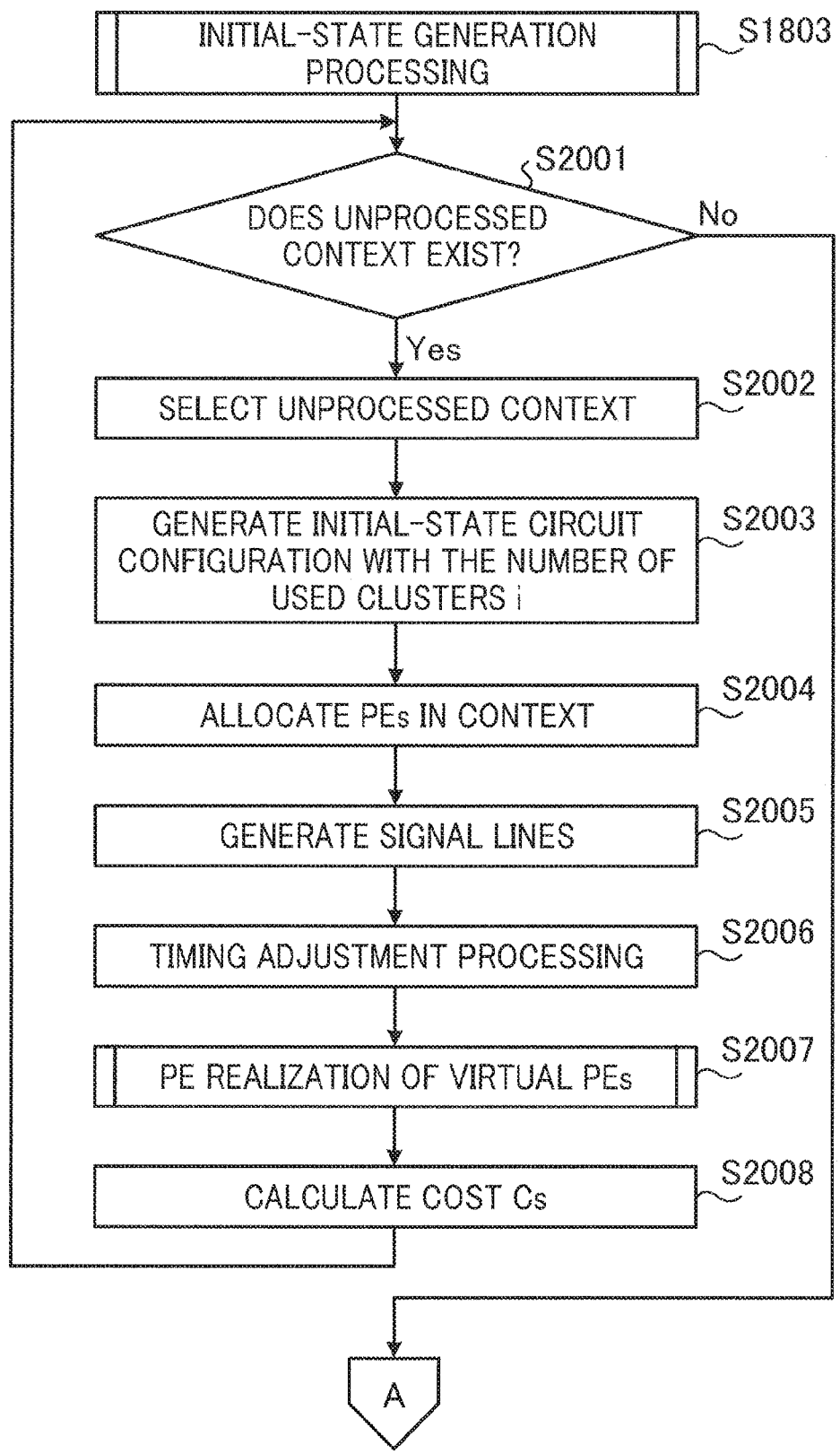
FIG. 20 is a flowchart of a detailed procedure (the former half) of initial-state generation processing.

Now, a detailed procedure of the initial-state generation processing will be described. FIG. 20 is a flowchart of the detailed procedure (the former half) of the initial-state generation processing. In FIG. 20, it is determined whether or not an unprocessed context exists (step S2001). If an unprocessed context exists (step S2001: Yes), the unprocessed context is selected (step S2002). An initial-state circuit configuration with the number of used clusters i is generated (step S2003).

Figure 22:
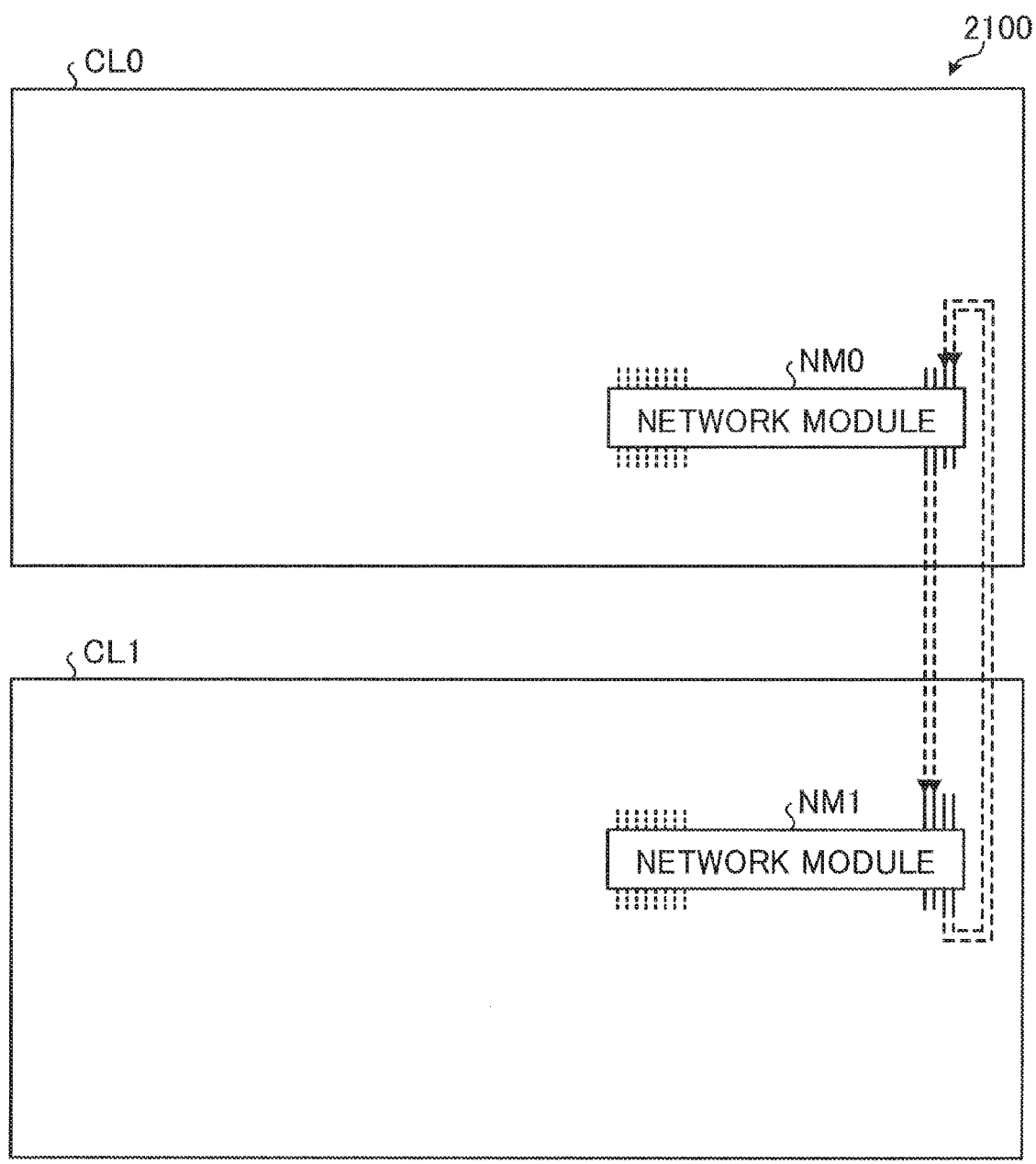
FIG. 22 is an illustrative diagram of an initial-state circuit configuration.

FIG. 22 is an illustrative diagram of an initial-state circuit configuration. For the initial-state circuit configuration 2100 in FIG. 22, the number of used clusters i is set as i=2. Each of the clusters CL0 and CL1 has ten network input/output terminals inside and two network input/output terminals between the clusters CL0 and CL1. Dotted lines connecting the network modules NM0 and NM1 in FIG. 22 indicate that the wiring is logically possible. This circuit configuration has no PEs disposed therein because PEs have not been mapped.

Returning to FIG. 20, after generating the initial-state circuit configuration 2100, PEs in the context CT are allocated (step S2004). Specifically, for example, beginning from the upstream portion of a data-flow graph of the selected context CT, the PEs are disposed in the clusters CL0 and CL1 so that the PEs are distributed evenly in number. The order in which the PEs are disposed in the clusters is, for example, the cluster CL0, the cluster CL1, and so on. As an exception, if it is specified that a PE be shared in the sharing specification file 505, and this PE is already disposed in another context CT, the PE is disposed in the same location. Also, if the disposition location is specified, the specification is followed.

Once the PEs are allocated, signal lines are generated (step S2005). After the signal lines are generated, timing adjustment processing is performed (step S2006). Specifically, for example, this process may involve the operation of inserting a delay device PE, in order to adjust the timing at a meeting point of PEs serving as a synchronization circuit, with this processing being commonly performed. The state after the generation of the signal lines is an initial disposition/wiring image (virtual image). When the wiring is implemented on a physical circuit, a flip-flop for maintaining the timing is introduced.

Thereupon, the timing at the meeting point is readjusted. Thus, the circuit configuration after the generation of the signal lines becomes a physical image. The PE realization of the virtual PEs is then performed (step S2007) to generate the initial-state circuit configuration. The PE realization of the virtual PEs (step S2007) will be described further below.

Figure 23:
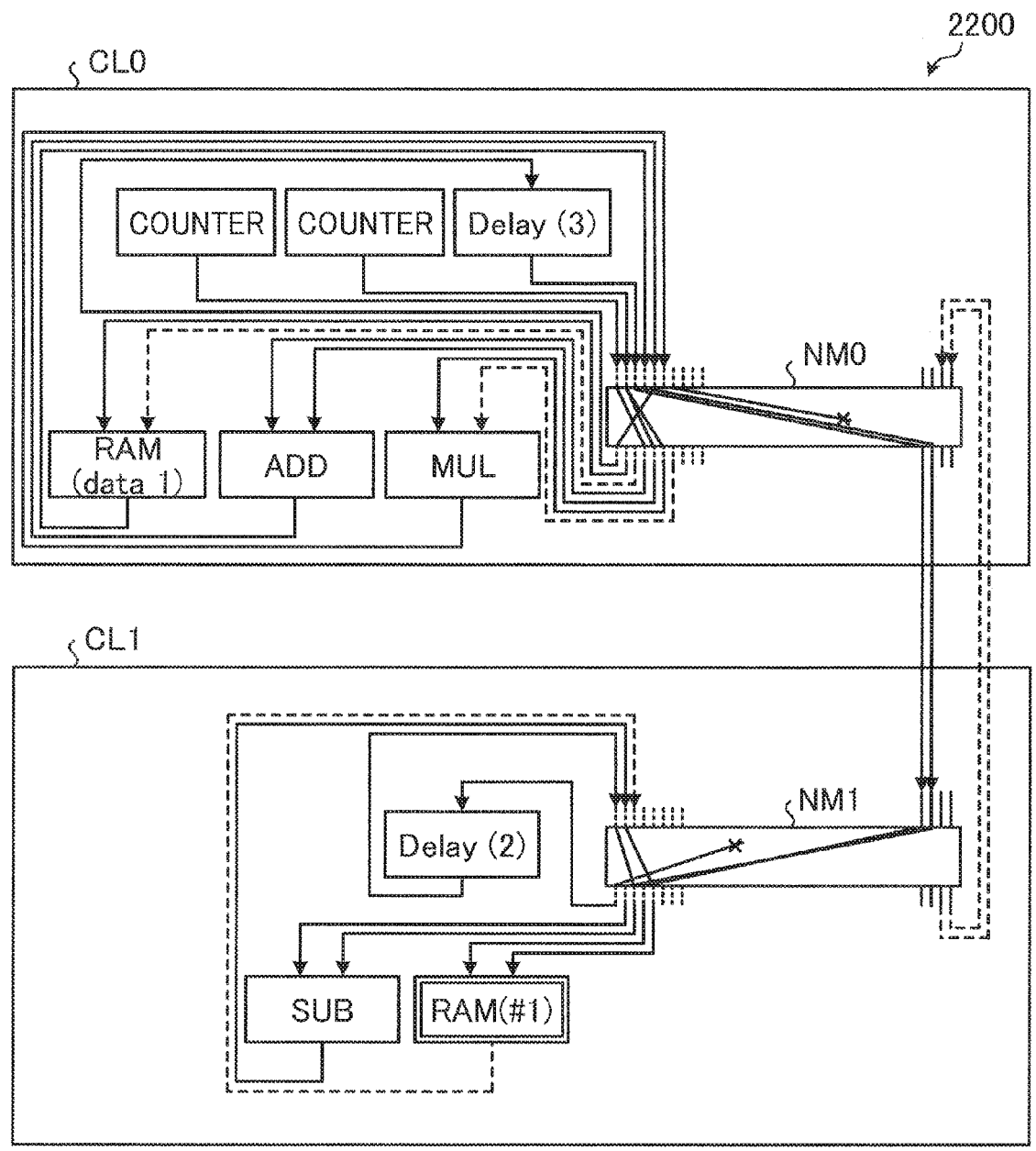
FIG. 23 is an illustrative diagram of the initial-state circuit configuration after PE realization.

FIG. 23 is an illustrative diagram of the initial-state circuit configuration after the PE realization. In the initial-state circuit configuration 2200 in FIG. 23, blocks other than the network modules NM0 and NM1 represent the PEs disposed in step S2004. Bold lines connecting the PEs and the network module NM0 (or NM1) and bold lines inside the network modules NM0 and NM1 represent the signal lines.

Symbols "x" inside the network modules NM0 and NM1 represent the failures to connect. For this initial-state circuit configuration 2200 after the PE realization, a cost Cs is calculated (step S2008). The calculated cost Cs is saved, along with the initial-state circuit configuration 2200 after the PE realization. The cost Cs is calculated with the following expressions (3) and (4), for example.

$$c_s = \left( \sum_j \sum_i \left[ \begin{array}{l} \theta(d_{j,i} - D_i) \cdot f_D \cdot |d_{j,i} - D_i| + \\ \theta(g_{j,i} - G_i) \cdot f_G |g_{j,i} - G_i| \end{array} \right] \right) + \quad (3)$$

$$\left( \sum_k \frac{\theta(h_k - H_k) \cdot}{f_H \cdot |h_k - H_k|} \right) + \left( \sum_i \sum_e \left[ \begin{array}{l} \theta(N_{i,e} - E_{i,e}) \cdot \\ f_E \cdot |N_{i,e} - E_{i,e}| \end{array} \right] \right)$$

$$\theta(x) = \begin{cases} 0 & (x < 0) \\ 1 & (x \geq 0) \end{cases} \quad (4)$$

where Cs is the cost of the s-th generated state, s being defined as s=0 in the initial state. i is the number of the cluster CL. j is the context number. dj, i is the number of used data network input/output terminals used in the context j and the cluster of the number i. More accurately, dj, i is the number of data network input/output terminals required in the context of the number j and the cluster of the number i. Di is a value of the number of data network input/output terminals in the cluster CLi minus a margin (see FIG. 19).

fD is an exceeding cost for the data network (see FIG. 19). gj, i is the number of used control network input/output terminals. More accurately, dj, i is the number of control network input/output terminals required in the context of the number j and the cluster of the number i. Gi is a value of the number of control network input/output terminals minus a margin (see FIG. 19). fG is an exceeding cost for the control network (see FIG. 19).

k is the number between clusters and between a cluster and the outside. hk is the number of wires required for the number k, and Hk is a value of the number of signal lines existing for the number k minus the margin. fH is an exceeding cost for the external interface (see FIG. 19). e is the PE type, and Ni, e is the required number of PEs "e" in the cluster CLi. Ei, e is the number of PEs "e" in the general cluster CLi, and fE is a general configuration cost (see FIG. 19). The obtained cost Cs is saved along with the virtual image. The expressions for obtaining the cost Cs are not limited to the above expressions (3) and (4), but may include other calculation expressions, as long as the annealing method can be employed for the cost.

Thereafter, the process returns to step S2001. By repeating the processing in steps S2001 to S2008, the initial-state circuit configuration with the number of used clusters i can be automatically generated for each context.

Figure 21:
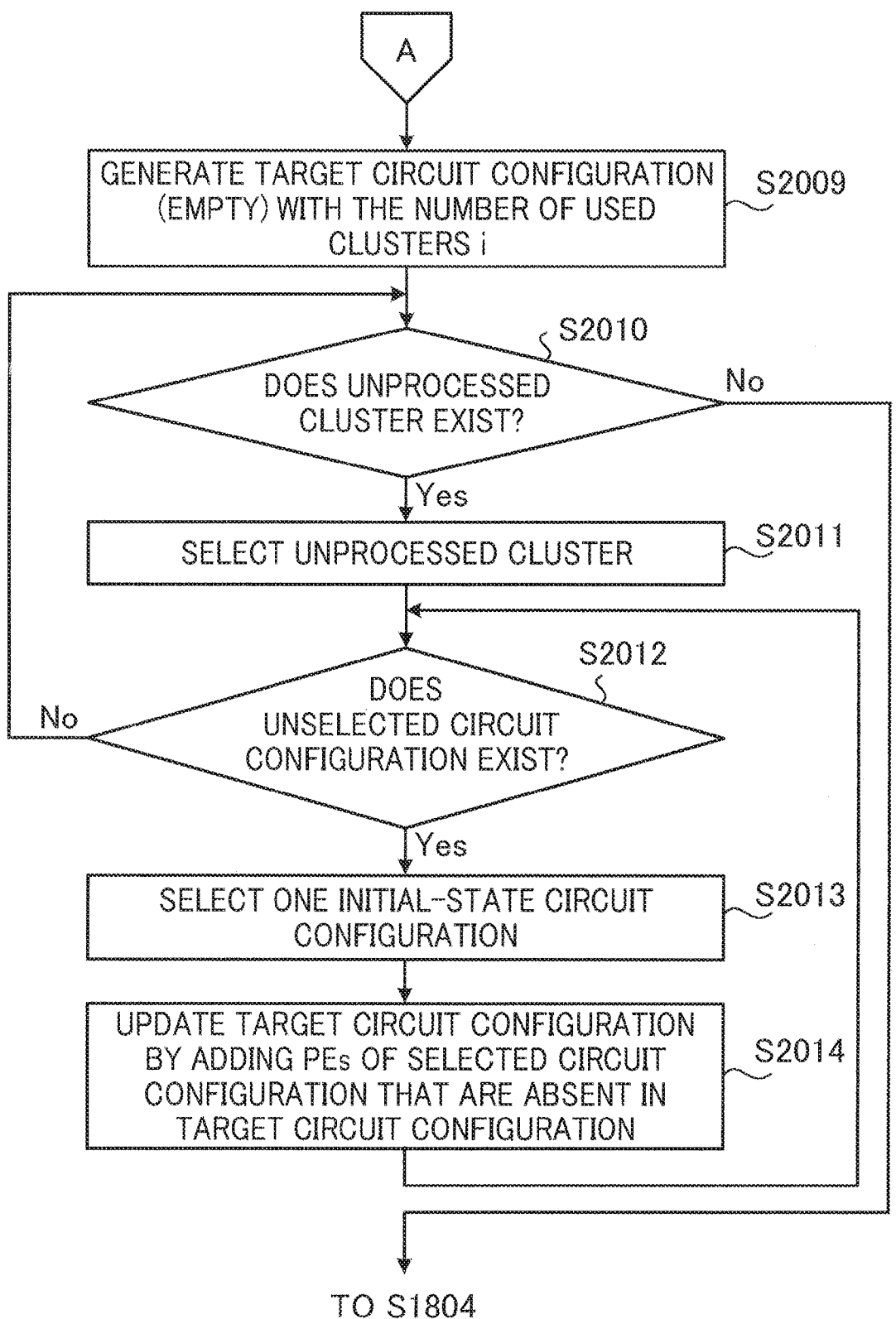
FIG. 21 is a flowchart of the detailed procedure (the latter half) of the initial-state generation processing.

FIG. 21 is a flowchart of the detailed procedure (the latter half) of the initial-state generation processing. In FIG. 21, a new initial-state circuit configuration is generated that comprehensively includes all the initial-state circuit configurations of the respective contexts generated in FIG. 20.

If it is determined that no unprocessed context exists in step S2001 of FIG. 20 (step S2001: No), a target circuit configuration with the number of used clusters i is generated (step S2009). This circuit configuration is similar to the circuit configuration represented in FIG. 22. To this circuit configuration, the initial-state circuit configuration of each context will be mapped.

Next, it is determined whether or not an unprocessed cluster exists (step S2010). If an unprocessed cluster exists (step S2010: Yes), the unprocessed cluster is selected (step S2011). It is determined whether or not an unselected circuit configuration exists (step S2012). If an unselected initial-state circuit configuration exists (step S2012: Yes), that initial-state circuit configuration is selected (step S2013) to update the target circuit configuration by adding PEs of the selected circuit configuration that are absent in the target circuit configuration (step S2014). The process then returns to step S2012.

If no unselected circuit configuration exists (step S2012: No), the process returns to step S2010. If no unprocessed cluster exists in step S2010 (step S2010: No), the process transitions to step S1804.

Next, a specific example of the addition/update in FIG. 21 will be described. It is assumed here that the circuit configuration 2100 illustrated in FIG. 21 is the target circuit configuration and that the circuit configuration 2200 illustrated in FIG. 23 is the initial-state circuit configuration of the context CT0.

Figure 24:
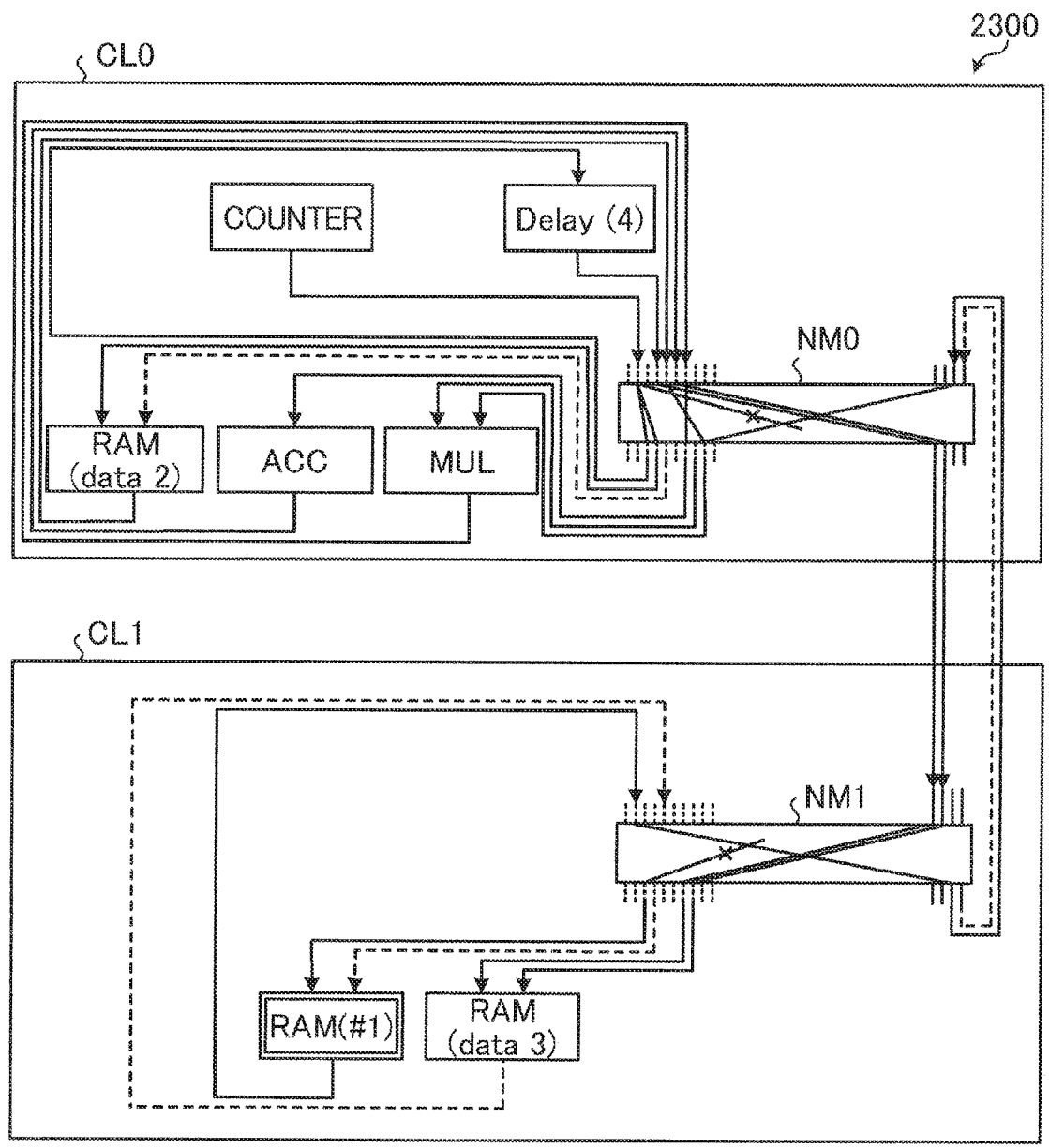
FIG. 24 is an illustrative diagram of an initial-state circuit configuration of a context CT1.

FIG. 24 is an illustrative diagram of an initial-state circuit configuration of the context CT1. It is assumed that the circuit configurations 2200 and 2300 in FIGS. 23 and 24 are the circuit configurations generated by the processing illustrated in FIG. 20. First, among the PEs in the initial-state circuit configuration 2200 of the context CT0 in FIG. 23, PEs that do not exist in the target circuit configuration 2100 are added to the target circuit configuration 2100 to update the target circuit configuration 2100.

Figure 25:
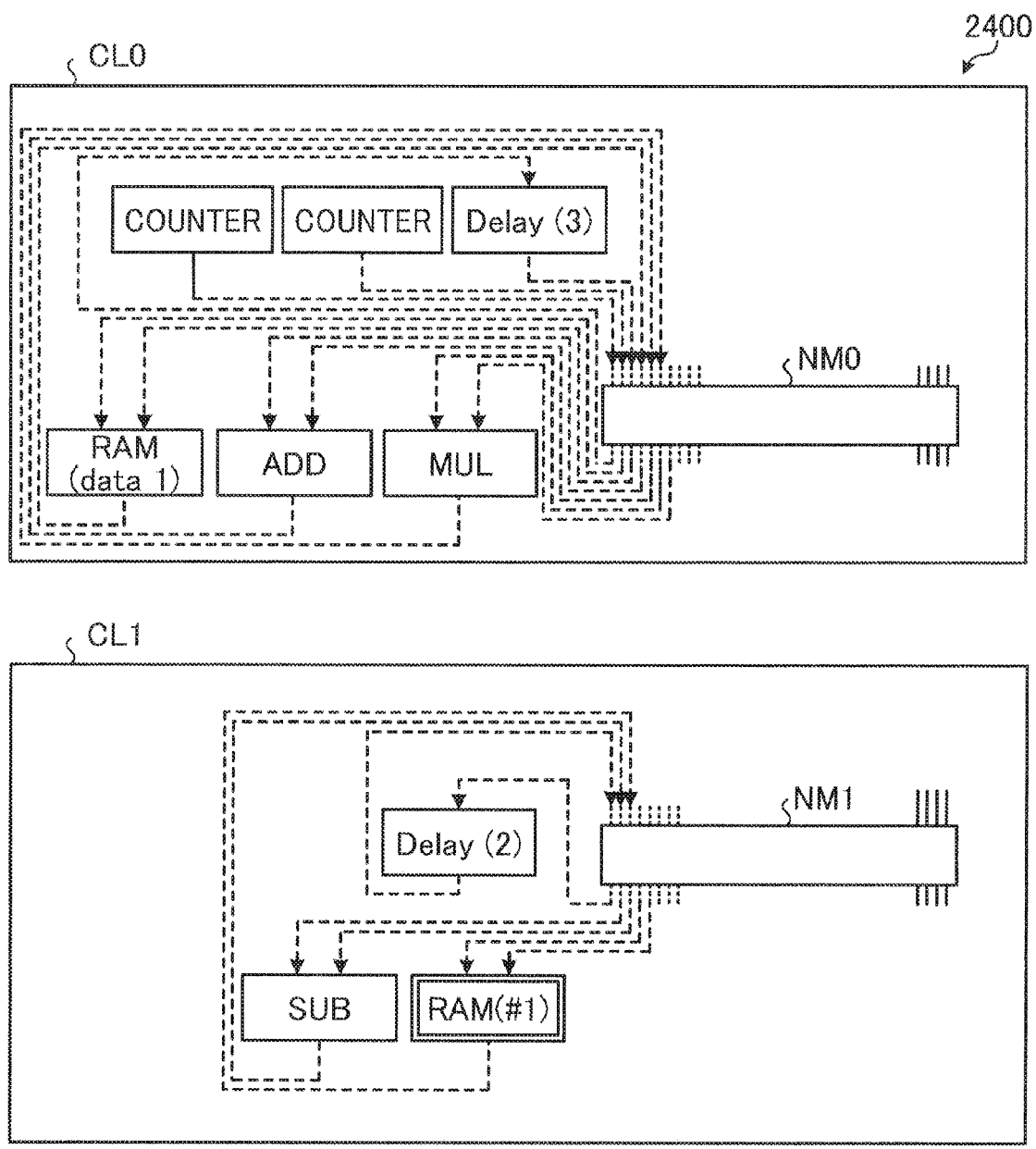
FIG. 25 is an illustrative diagram (a first diagram) of the circuit configuration after addition/update.

FIG. 25 is an illustrative diagram (a first diagram) of the circuit configuration after the addition/update. In the circuit configuration 2400 in FIG. 25, PEs that do not exist in the initial-state circuit configuration 2100 in FIG. 22 have been mapped. Then, among the PEs in the initial-state circuit configuration 2300 of the context CT1 in FIG. 24, PEs that do not exist in the target circuit configuration 2400 in FIG. 25 are added to the target circuit configuration 2400 to update the target circuit configuration 2400.

Figure 26:
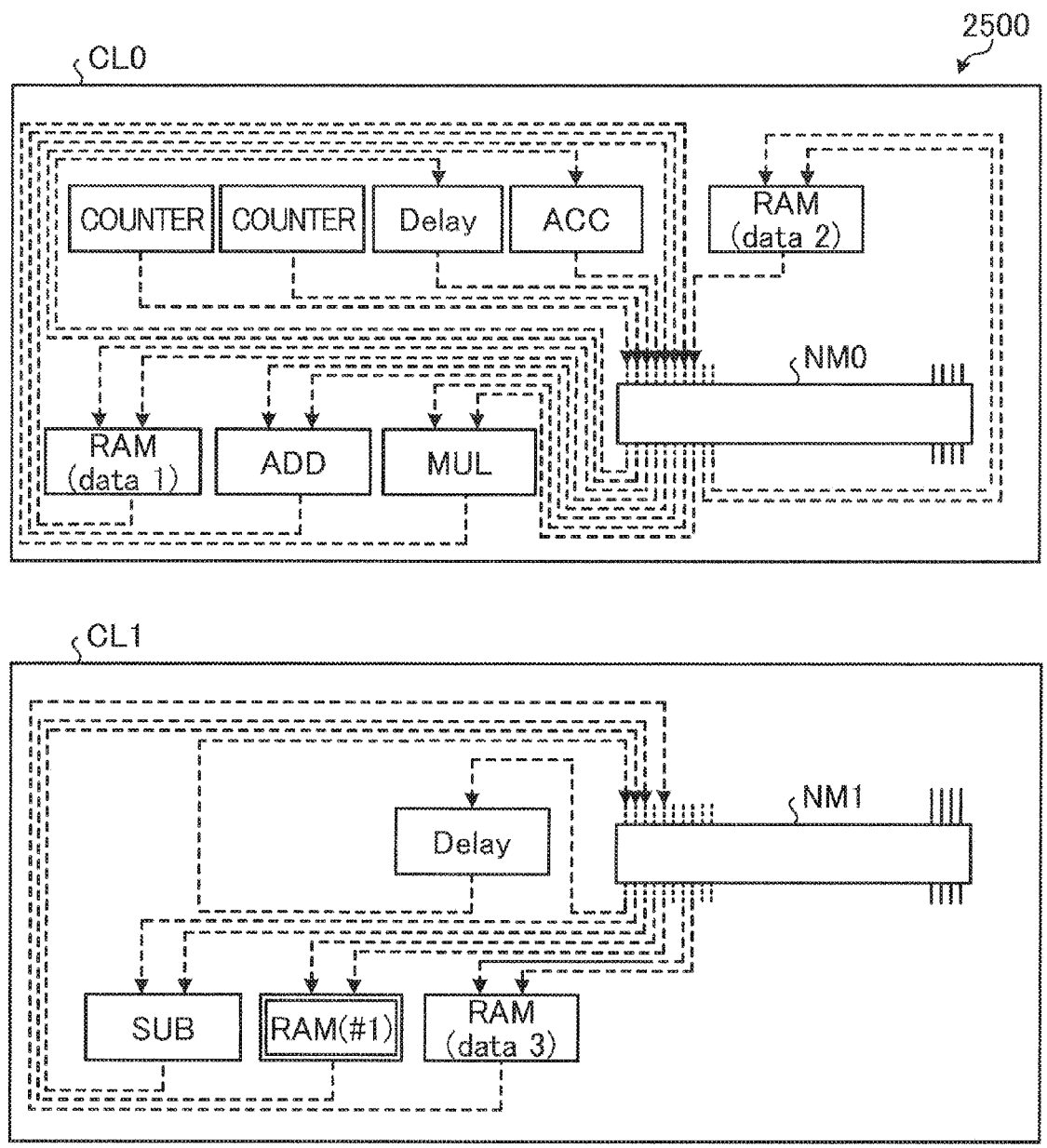
FIG. 26 is an illustrative diagram (a second diagram) of the circuit con figuration after the addition/update.

FIG. 26 is an illustrative diagram (a second diagram) of the circuit configuration after the addition/update. In the circuit configuration 2500 in FIG. 26, PEs that do not exist in the initial-state circuit configuration 2400 in FIG. 25 have been mapped. Thus, the initial-state circuit configuration 2500 can be obtained that comprehensively includes the PEs in the initial-state circuit configuration 2200 of the context CT0 and the PEs in the initial-state circuit configuration 2300 of the context CT1.

Next, the PE realization (step S2007) of the virtual PEs illustrated in FIG. 20 will be described. Virtual PEs are the PEs in the contexts CT in FIG. 1, whereas physical PEs are the mapped PEs as illustrated, for example, in FIGS. 23 to 26.

Figure 27:
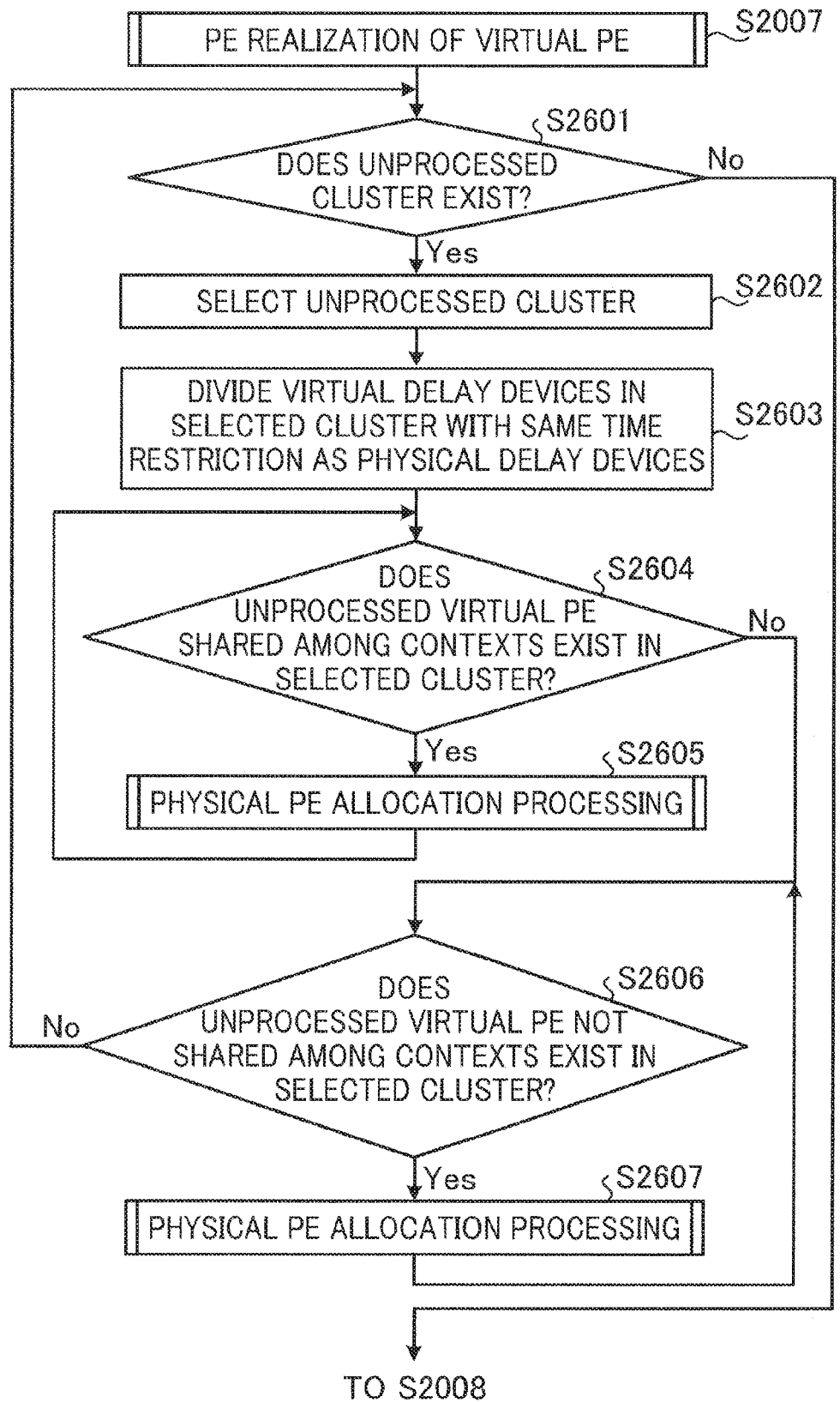
FIG. 27 is a flowchart of a detailed procedure of the PE realization of virtual PEs.

FIG. 27 is a flowchart of a detailed procedure of the PE realization of the virtual PEs. First, it is determined whether or not an unprocessed cluster exists (step S2601). If an unprocessed cluster exists (step S2601: Yes), the unprocessed cluster is selected (step S2602) and virtual delay devices in the selected cluster are divided with the same or similar temporal restriction as physical delay devices (step S2603).

It is determined whether or not an unprocessed virtual PE shared among the contexts exists in the selected cluster (step S2604). If an unprocessed virtual PE exists (step S2604: Yes), physical PE allocation processing is performed (step S2605), and the process returns to step S2604. If no unprocessed virtual PE exists (step S2604: No), it is determined whether or not an unprocessed virtual PE not shared among the contexts exists in the selected cluster (step S2606).

If an unprocessed virtual PE exists (step S2606: Yes), the physical PE allocation processing is performed (step S2607) and the process returns to step S2606. If no unprocessed virtual PE exists (step S2606: No), the process returns to step S2601. If no unprocessed cluster exists in step S2601, (step S2601: No), the process transitions to step S2008.

Figure 28:
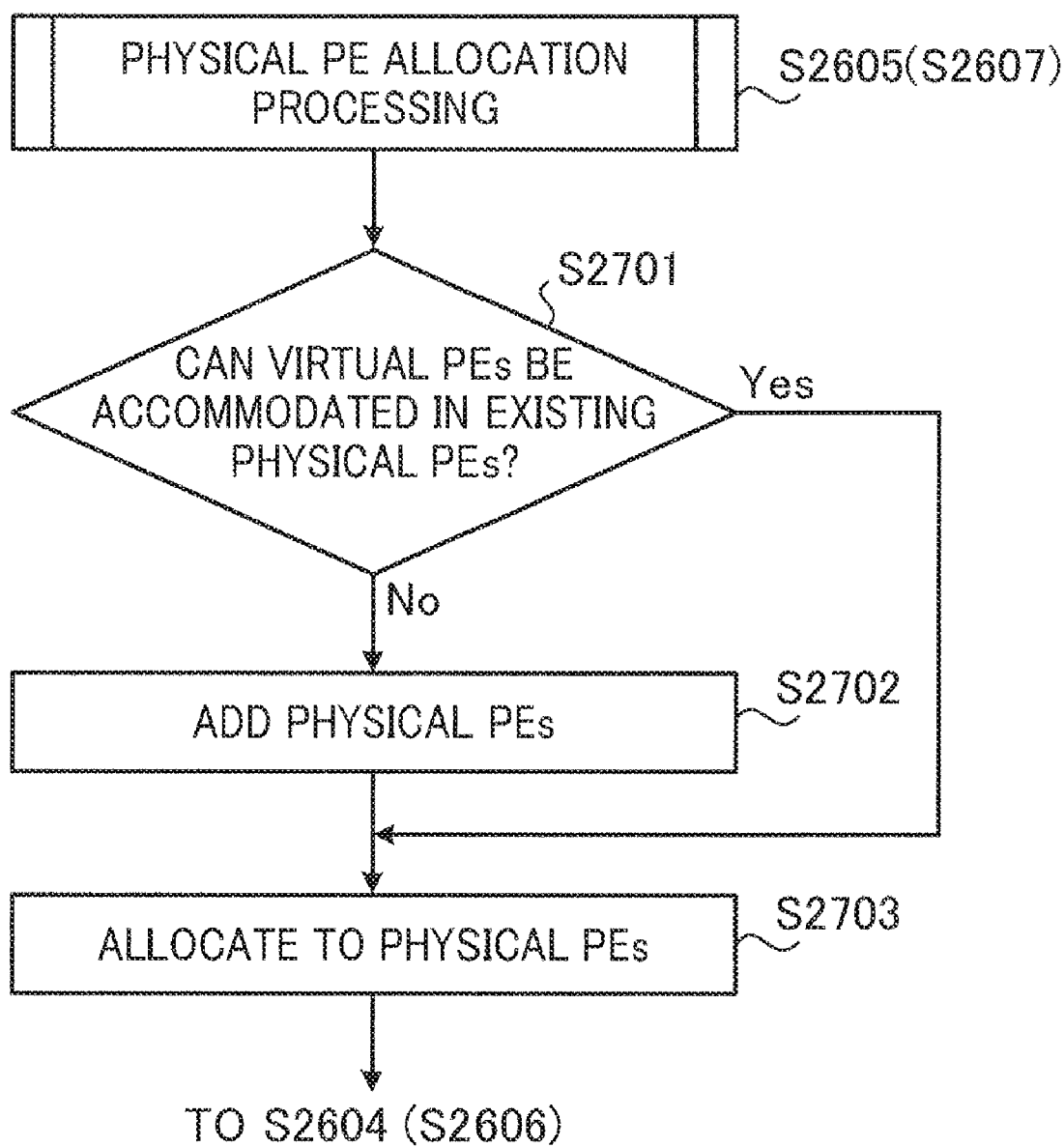
FIG. 28 is a flowchart of a detailed procedure of physical PE allocation processing.

FIG. 28 is a flowchart of a detailed procedure for physical PE allocation processing. First, it is determined whether or not the virtual PEs can be accommodated in existing physical PEs (step S2701). If the virtual PEs cannot be accommodated (step S2701: No), physical PEs are added (step S2702) to allocate the virtual PEs to the physical PEs (step S2703). If the virtual PEs can be accommodated (step S2701: Yes), the virtual PEs are allocated to the physical PEs (step S2703).

Next, a detailed procedure of the next-state generation processing (step S1805) illustrated in FIG. 18 will be described. The next-state generation processing (step S1805) includes processing of generating next-state circuit configurations based on the current-state circuit configurations if the current-state circuit configurations are not feasible.

Figure 29:
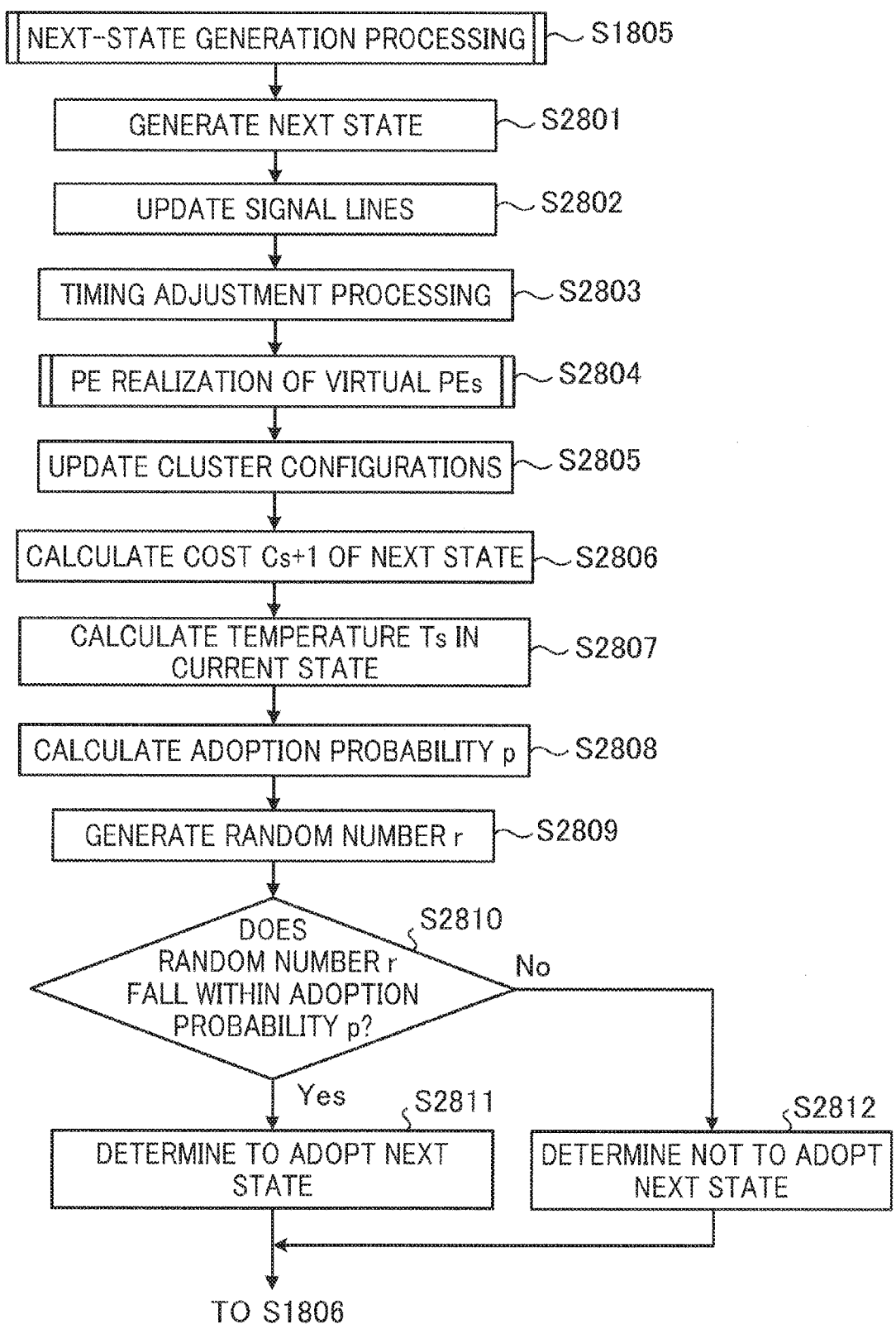
FIG. 29 is a flowchart of a detailed procedure of next-state generation processing illustrated in FIG. 18 (step S1805)

FIG. 29 is a flowchart of a detailed procedure for next-state generation processing, as illustrated, for example, in FIG. 18 (step S1805). In FIG. 29, in a current-state circuit configuration, a PE selected using a random number that is read as a parameter is moved to a cluster also selected using a random number, such that a next-state circuit configuration is generated (step S2801).

Specifically, for example, a context, a cluster, and a PE may be randomly selected. A destination cluster to which the PE is to be moved may also be randomly selected, and the PE moved to the cluster. However, immovable PEs with disposition locations specified are prevented from being selected. The solution can be efficiently obtained by controlling the probability distribution in selecting the context, the cluster, the PE, the PE type, and the destination cluster. The wiring is modified accordingly as the PE is moved. If the PE is shared, the PE is also moved in the same or similar manner in another context that share the PE. The generated next state is stored in a storage area different from the one storing the current state, so as not to erase the current state.

For the resulting next-state circuit configuration, signal lines are updated (step S2802), timing adjustment processing at the meeting point of PEs serving as a synchronization circuit is performed (step S2803), PE realization of the virtual PEs is performed (step S2804), and the cluster configuration is updated (step S2805). The procedure of the PE realization of the virtual PEs (step S2804) is the same as or similar to the procedures illustrated in FIGS. 27 and 28. The update of the cluster configuration (step S2805) is performed if real PEs are added or removed.

Thereafter, the above expressions (3) and (4) are used to calculate a cost $C_{s+1}$ of the next-state circuit configurations (step S2806). The obtained cost $C_{s+1}$ is saved along with the next-state circuit configurations. A temperature $T_s$ in the current state is calculated with the following expression (5) (step S2807).

$$T_s = T_f + (T_i - T_f)\exp\left(-\frac{\mathrm{mod}(s, R)}{l}\right) \quad (5)$$

where Tf denotes the maximum and Ti denotes the minimum of the temperature Ts, l denotes an attenuation parameter, R denotes the number of cycles before reheating, and mod(s, R) denotes the remainder left when s is divided by R. With respect to the cost Cs, due to the parameter setting, the temperature Ts decreases as mod(s, R) increases. For example, if the number of cycles R is set as R=10,000, the temperature Ts takes the minimum Ti when s=0 and approaches the maximum Tf as s increases. Since the temperature is typically cooled down in the annealing method, Tf<Ti is set and Ts decreases. When s=9,999, the temperature Ts takes the minimum Ti. Since mod(s, R)=0 when s=10,000, the temperature Ts again takes the minimum Ti, and decreases until s=19,999. Likewise, thereafter the temperature Ts repeats, returning to the minimum Ti at multiples of the number of cycles R and decreasing until the next multiple. Ts, Tf, and Ti are all real numbers larger than 0.

Subsequently, the adoption probability p ($0 \leq p \leq 1$) is calculated with the following expression (6) (step S2808). Since the cost Cs+1 may be smaller than the cost Cs, the adoption probability p may be larger than 1. In that case, p=1 is set. The adoption probability p decreases as the temperature Ts decreases, and therefore, in this event, it is more likely that the next-state circuit configurations are not adopted and the state settles into the current state.

$$p = \exp\left(\frac{c_s - c_{s+1}}{T_s}\right) \quad (6)$$

Since the temperature Ts is a positive value, the adoption probability p takes a value smaller than 1 if Cs+1 is larger than Cs. While the temperature Ts is high, the adoption probability p takes a large value even if the Cs+1 is much larger than Cs. Therefore, the next state is likely to be adopted even if the next state involves a higher cost. As a result, Cs may increase. As the temperature Ts decreases, the adoption probability p takes a smaller value, even if Cs+1 is only slightly larger than Cs. Therefore, higher-cost states are unlikely to be adopted, and the state basically transitions to lower-cost states. When a lower-cost state is unlikely to be found, the state settles into the state at that point.

For example, supposing that the mapping of the dynamic reconfigurable circuits corresponding to a mass of iron, then Cs corresponds to the temperature of the mass of iron and Ts corresponds to the ambient temperature. It is assumed here that Ts can be controlled by an air-conditioner or the like. The temperature Ts being high means that the air-conditioner is increasing the ambient temperature. Since the mass of iron (the mapping of the dynamic reconfigurable circuits) is heated under the environmental influence, its temperature Cs also increases. Reducing Ts means that the air-conditioner cools down the mass of iron, and therefore the temperature Cs of the mass of iron also decreases.

Once the adoption probability p is calculated, a random number r ($0 \leq r < 1$) is generated (step S2809), and it is determined whether or not the random number r falls within the adoption probability p (whether $r \leq p$) (step S2810). If $r \leq p$ (step S2810: Yes), it is determined to adopt the next state (step S2811), and the process transitions to step S1806. If not $r \leq p$ (step S2810: No), it is determined not to adopt the next state (step S2812), and the process transitions to step S1806. The expressions (5) and (6) may be replaced with other functions as long as they meet the above purpose.

As long as the state adopted in this manner does not satisfy the constraints of the hardware element information 502, the process repeats from the generation of the next state. When all the contexts satisfy the constraints, the circuit configurations are complete, and the process terminates. A specific example will now be provided.

Figure 30:
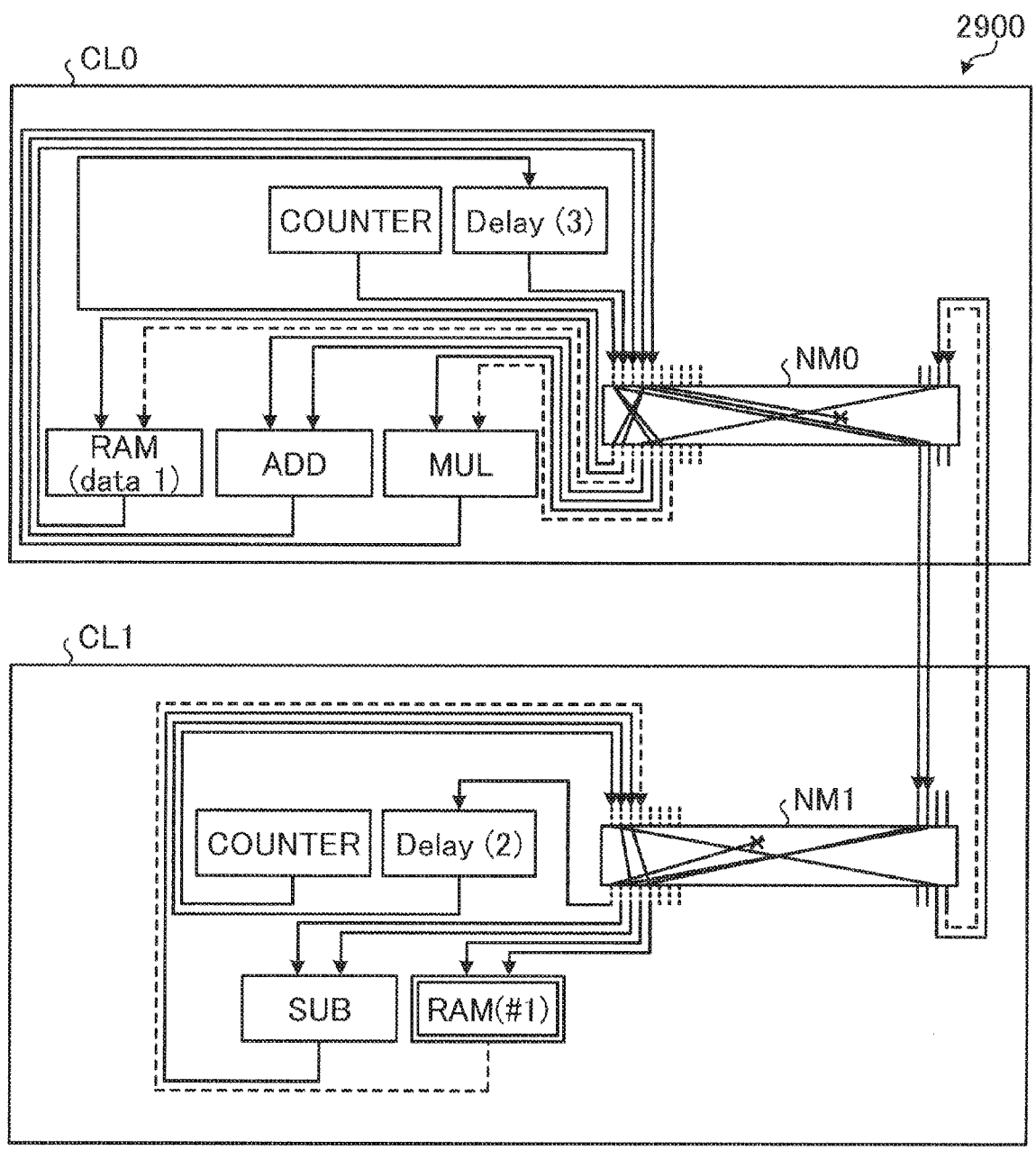
FIG. 30 is an illustrative diagram of a next-state circuit configuration of the circuit configuration in FIG. 23.

FIG. 30 is an illustrative diagram of a next-state circuit configuration 2200 of the circuit configuration in FIG. 23. For example, during the processing of the logical assemblers 501 illustrated in FIG. 4, the next-state circuit configuration 2900 illustrated in FIG. 30 does not satisfy the constraints of the hardware element information 502, and therefore the process repeats from the generation of the next state. Specifically, counter (counter circuit), e.g., a PE that was in the cluster CL0 in FIG. 23, has been moved to the cluster CL1, but the wiring between PEs that were not able to be connected in the circuit configuration 2200 in FIG. 23 is still not realized. Therefore, the constraints are not satisfied.

Figure 31:
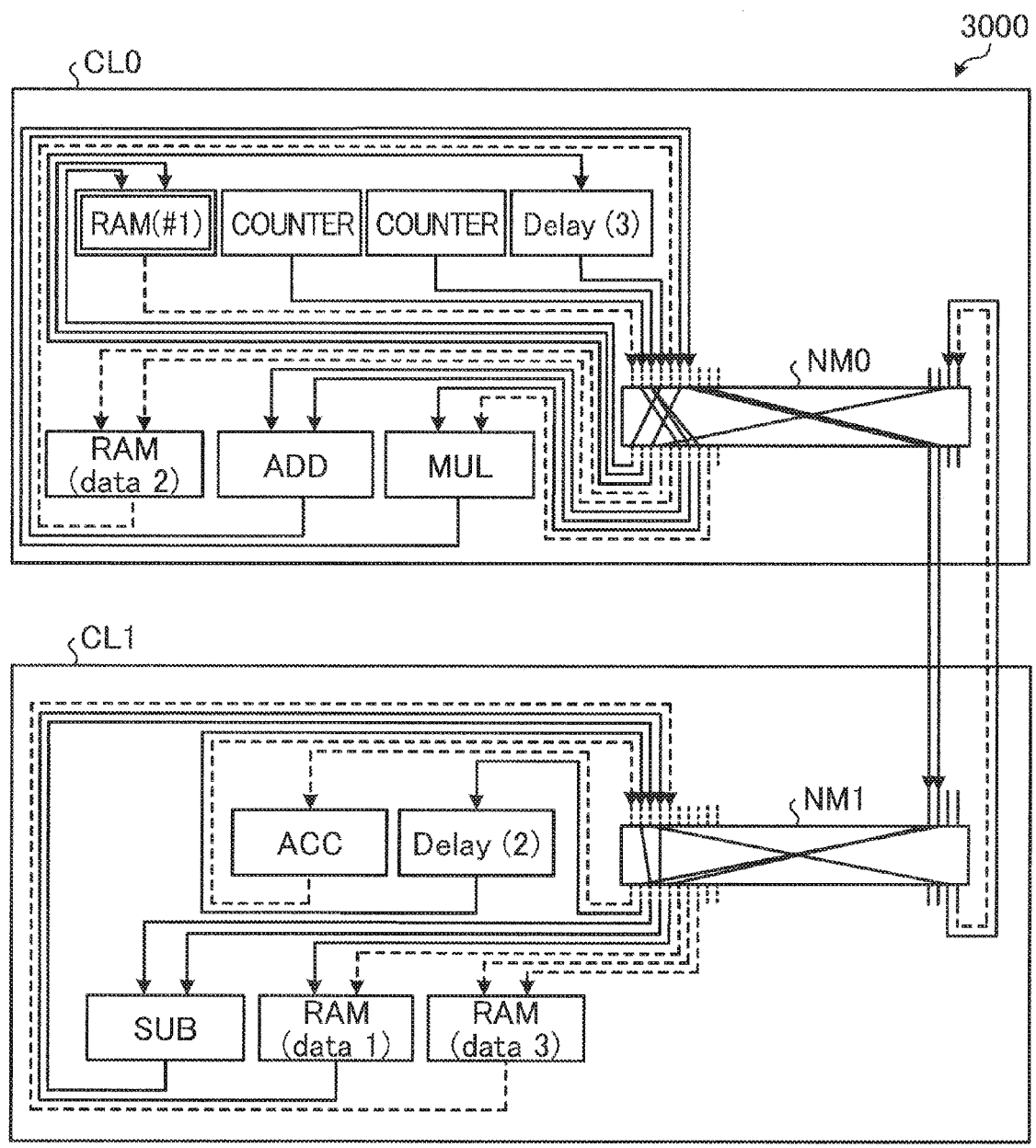
FIG. 31 is an illustrative diagram of a circuit configuration to which the context CT0 has been mapped.

FIG. 31 is an illustrative diagram of a circuit configuration to which the context CT0 has been mapped. In the circuit configuration 3000 illustrated in FIG. 31, dotted lines represent unused physical wires. The PEs of the context CT1 are also included.

Figure 32:
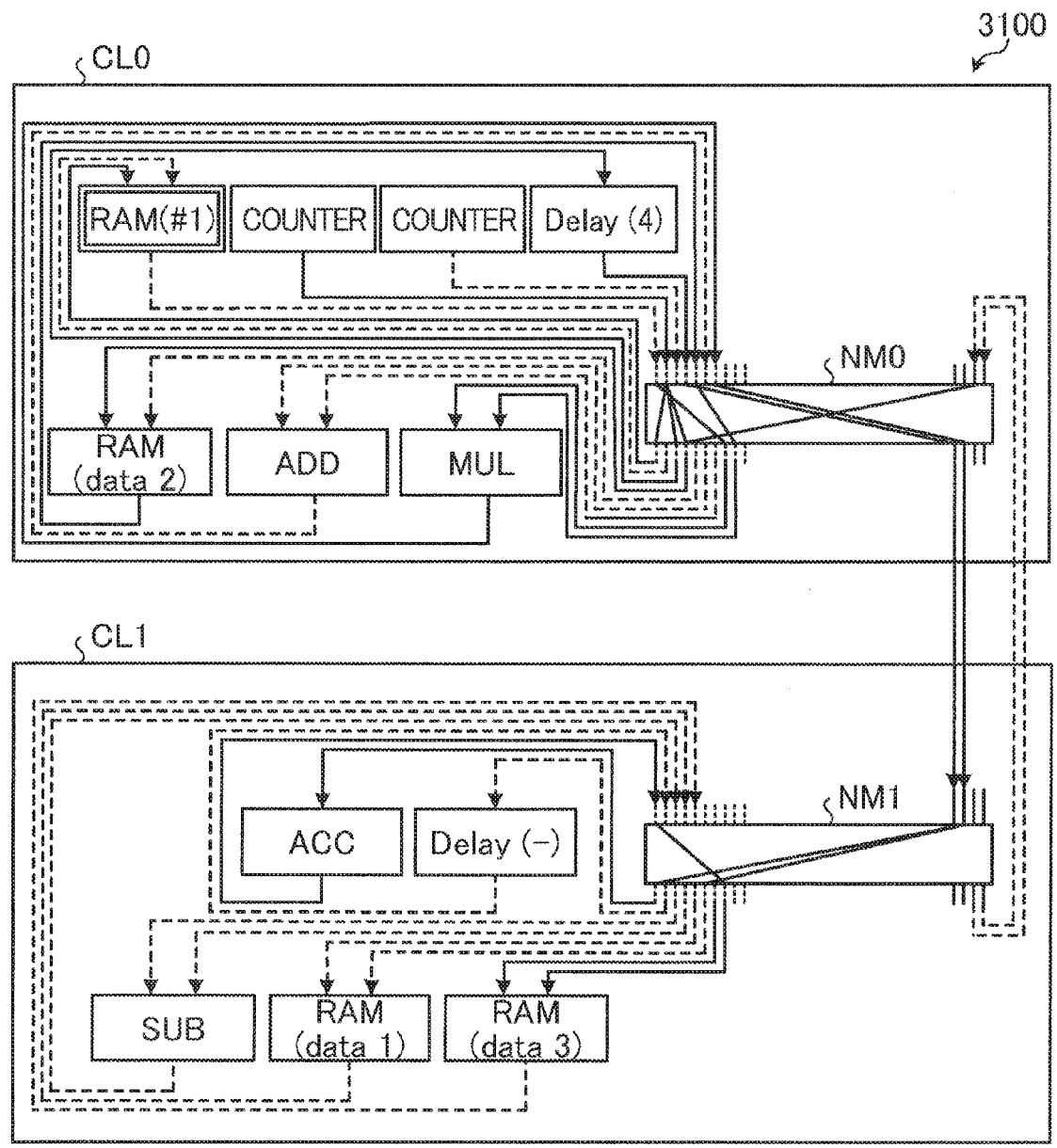
FIG. 32 is an illustrative diagram of a circuit configuration to which the context CT1 has been mapped.

FIG. 32 is an illustrative diagram of a circuit configuration to which the context CT1 has been mapped. The circuit configuration 3100 in FIG. 32 is a configuration in which the wiring and instructions to the PEs in the circuit configuration 3000 in FIG. 31 have been modified, and to which the context CT1 has been mounted.

With the circuit configurations 3000 and 3100 in FIGS. 31 and 32, all the contexts CT0 and CT1 satisfy the constraints. Therefore, the process terminates. The circuit configurations 3000 and 3100 in FIGS. 31 and 32 correspond to the physical assemblers 508. As an exception, if circuit configurations that satisfy the constraints are not found even after a predetermined number of iterations of generating the next state, the process terminates with a failure to generate the circuit configurations.

(Generalization Processing)

Next, generalization processing (step S1509) illustrated in FIG. 15 will be described in further detail. Generalization processing (step S1509) is processing for bringing the element configuration in each cluster closer to a balanced one by adding extra PEs within the constraints. This approach enhances the generality. Specifically, for example, this processing is performed if an area, power, and the like are still available after the PEs are disposed. The balanced configuration is provided by the general element configuration file 504 prepared beforehand.

Figure 33:
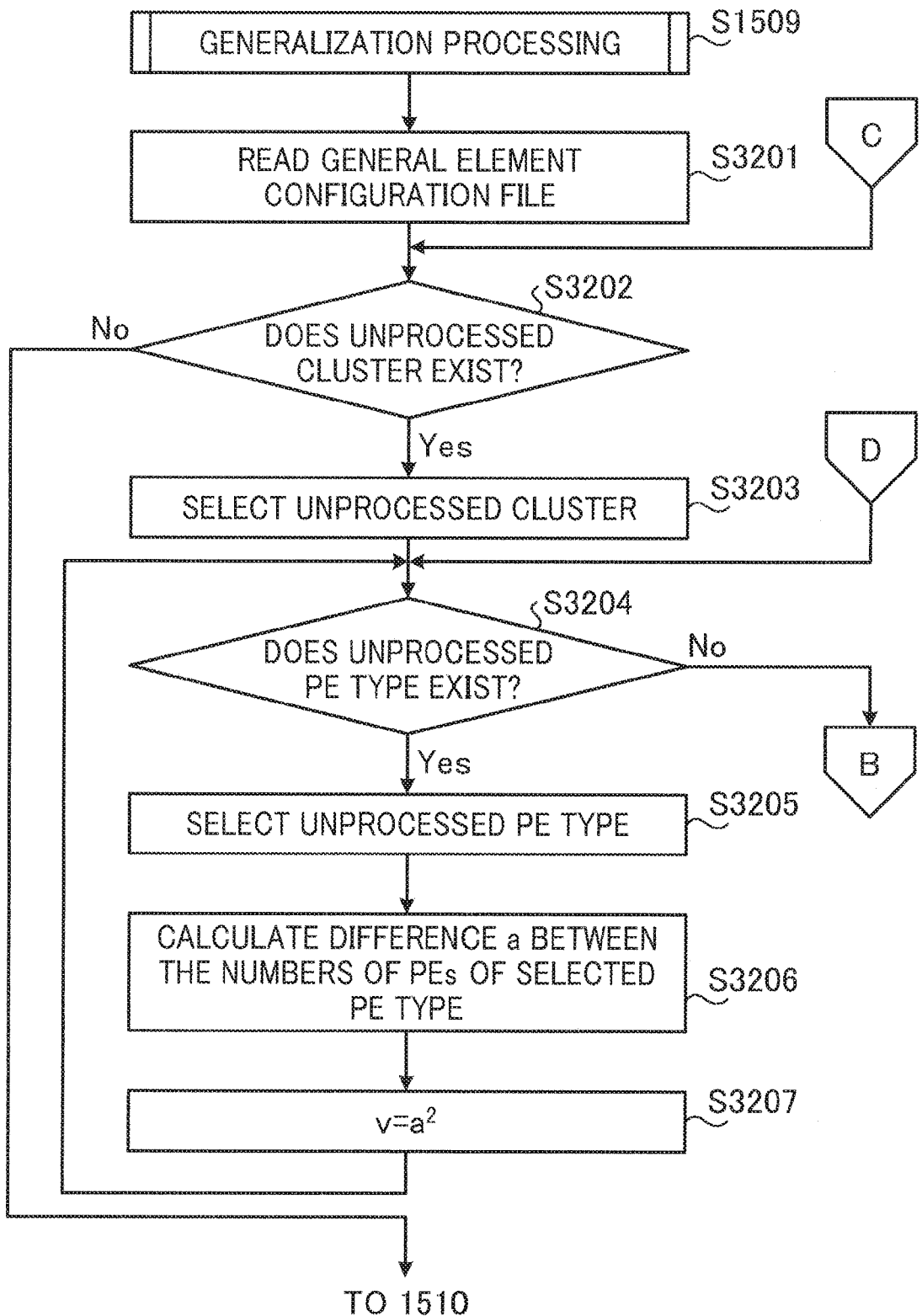
FIG. 33 is a flowchart of a detailed procedure (the former half) of generalization processing (step S1509)

FIG. 33 is a flowchart of a detailed procedure (the former half) of generalization processing (step S1509). First, the general element configuration file 504 is read (step S3201). It is then determined whether or not an unprocessed cluster exists (step S3202). If no unprocessed cluster exists (step S3202: No), the process transitions to step S1510 illustrated in FIG. 15.

If an unprocessed cluster exists (step S3202: Yes), the unprocessed cluster is selected (step S3203). It is then determined whether or not an unprocessed PE type exists (step S3204). If an unprocessed PE type exists (step S3204: Yes), the unprocessed PE type is selected (step S3205). A difference a is computed by subtracting the number of PEs of the selected PE type in the cluster from the number of PEs of the selected PE type in the general element configuration file 504 (step S3206).

The difference "a" is squared and set as v (step S3207). v is an index value representing the magnitude of the difference between the numbers of PEs. Any function that can be used as an index value may be used. Once a list is generated for the selected PE type in step S3207, the process returns to step S3204. If no unprocessed PE type exists in step S3204 (step S3204: No), the process transitions to step S3209 in FIG. 34.

FIG. 35 is an illustrative diagram of a list that indicates the number of PEs of each PE type in each cluster in the generated circuit configurations. FIG. 36 is an illustrative diagram of a list that indicates the difference "a" obtained by subtracting the number of PEs of each selected PE type in each cluster from the number of PEs of each selected PE type in the general element configuration file 504. FIG. 37 is an illustrative diagram of a list that indicates the index value v for each PE type in each cluster in the generated circuit configurations. The lists of FIGS. 36 and 37 are complete when no unprocessed PE type exists in step S3204 (step S3204: No).

Figure 34:
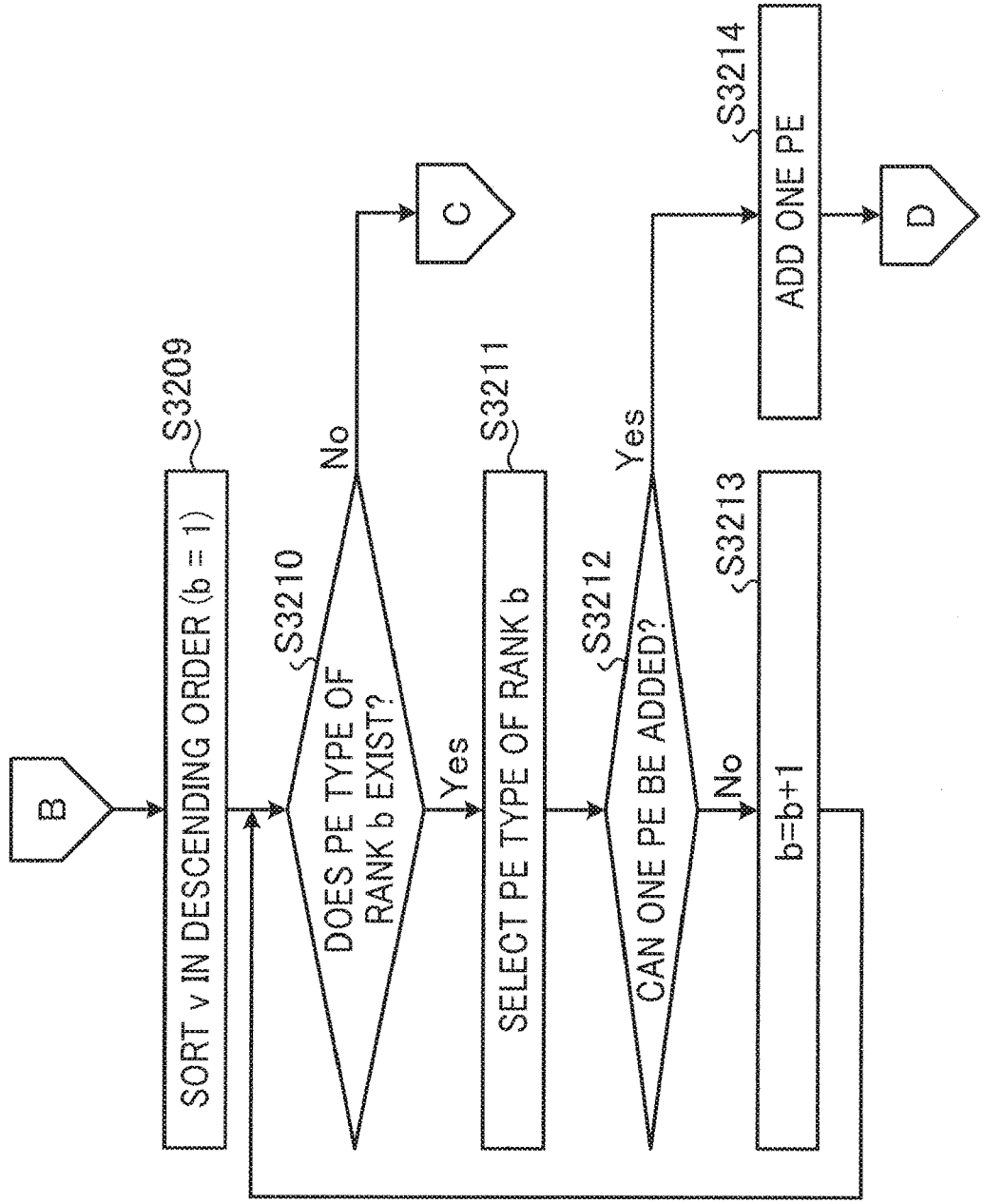
FIG. 34 is a flowchart of the detailed procedure (the latter half) of the generalization processing (step S1509)

FIG. 34 is a flowchart of the detailed procedure (the latter half) of generalization processing (step S1509). The index values v are sorted in descending order (step S3209). As a result of this sorting, a rank b is set as b=1. It is determined whether or not a PE type of rank b exists (step S3210). If a PE type of rank b exists (step S3210: Yes), the PE type of rank b is selected (step S3211). It is then determined whether or not one PE of the selected PE type can be added (step S3212).

Specifically, for example, if a network input/output terminal is available, it is determined that one PE can be added: otherwise, it is determined that no PE can be added. If no PE can be added (step S3212: No), the rank b is incremented (step S3213), and the process returns to step S3210. If a PE can be added (step S3212: Yes), one PE of the selected PE type is added to the selected cluster (step S3214), and the process returns to step S3204 in FIG. 33. The added PE is treated as an unprocessed PE. If no PE type of rank b exists in step S3210 (step S3210: No), the process returns to the step S3202 in FIG. 33.

When all the clusters have been processed by the above processing in FIGS. 33 and 34 the generalization processing terminates. Thus, the element configuration of each cluster can be brought closer to a balanced one by adding extra PEs within the constraints.

(Functional Configuration of Design Apparatus 500)

In the light of the foregoing, an exemplary functional configuration of the design apparatus 500 will be described.

Figure 38:
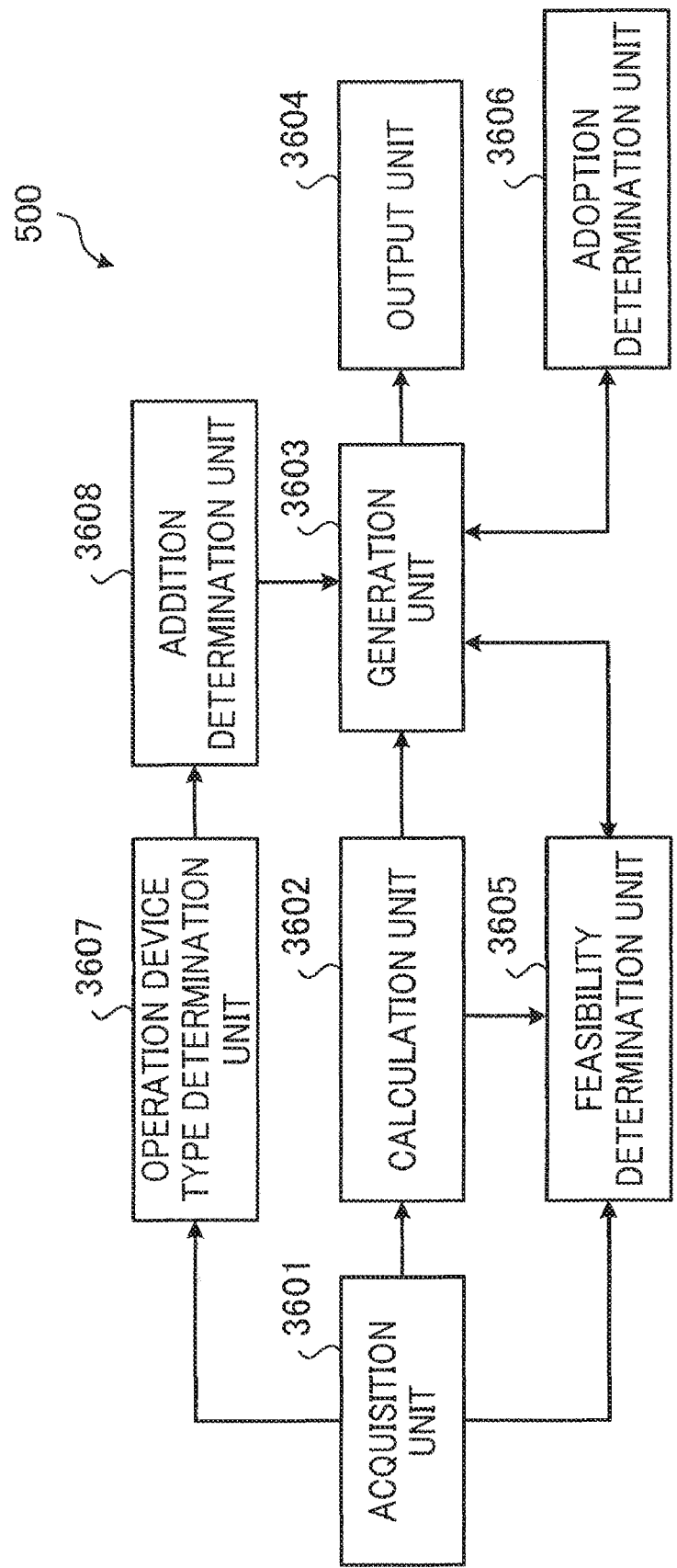
FIG. 38 is a block diagram of a functional configuration of the design apparatus.

FIG. 38 is a block diagram of the functional configuration of the design apparatus 500 in accordance with aspects of the present invention. The design apparatus 500 has a configuration including an acquisition unit 3601, a calculation unit 3602, a generation unit 3603, an output unit 3604, a feasibility determination unit 3605, an adoption determination unit 3606, an operation device type determination unit 3607, and an addition determination unit 3608. Specifically, for example, those features (the acquisition unit 3601 to the addition determination unit 3608) serving as a control unit realize their functions by causing the CPU 1401 to execute a program stored in a storage area, such as the ROM 1402, the RAM 1403, the magnetic disk 1405, or the optical disk 1407 illustrated in FIG. 14, or by means of the I/F 1409.

The acquisition unit 3601 performs the function of acquiring a plurality of contexts having connection information between operation devices and network modules, wherein the operation devices and network modules are disposed in clusters, as well as connection information among the network modules. Specifically, for example, the acquisition unit 3601 reads the logical assemblers 501 that describe the contexts CT0 and CT1 illustrated in FIGS. 5 and 6.

The calculation unit 3602 has a function of calculating a cluster count of the clusters and an operation device count (PE count) for each operation device type (PE type) in each cluster, based on the plurality of contexts acquired by the acquisition unit 3601. Specifically, for example, the calculation unit 3602 converts the contexts CT into data flows and calculates minimum required numbers for the PEs and the clusters, as illustrated in step S1503 of FIG. 15 and in FIGS. 16 and 17. The calculated minimum required numbers are Output as the element configuration definition file 506.

By calculating the minimum required number of PEs, any shortage of PEs in generating the circuit configurations can be solved. Also, by calculating the minimum required number of clusters, generation of unfeasible circuit configurations can be prevented. Therefore, unnecessary designing can be eliminated so as to shorten the design period.

The generation unit 3603 has the function of generating a circuit configuration for each context in which disposition of the operation devices in each cluster and connection of the network modules are made, so as to satisfy the cluster count and the operation device count calculated by the calculation unit 3602. Specifically, for example, the generation unit 3603 performs circuit configuration generation processing with the number of used clusters i (step S1506) illustrated in FIGS. 15 and 18 and the initial-state generation processing (step S1803) illustrated in FIGS. 18 and 20. Besides the circuit configuration, the generation unit 3603 also generates output information 520.

The output unit 3604 has the function of outputting the circuit configuration generated by the generation unit 3603. Specifically, for example, the output unit 3604 outputs the various sorts of output information 520 illustrated in FIG. 5. Exemplary output forms include displaying on the display 1408, printing on the printer 1413, and transmitting to an external apparatus via the I/F 1409. The output information 520 may be stored in a storage area, such as the RAM 1403, the magnetic disk 1405, or the optical disks 1407.

The generation unit 3603 can also generate a circuit configuration that comprehensively includes the circuit configurations generated for the respective contexts. Specifically, for example, the generation unit 3603 performs initial-state generation processing (steps S2009 to S2014), illustrated in FIG. 21. In this case, the output unit 3604 outputs at least any one of the circuit configurations generated for the respective contexts and the circuit configuration that comprehensively includes the respective circuit configurations.

For instance, in the above-described example, the output unit 3604 outputs a circuit configuration selected from the circuit configuration 2200 for the context CT0, the circuit configuration 2300 for the context CT1, and the comprehensive circuit configuration 2500 for the contexts CT0 and CT1. The particular circuit configuration to be output is preset. Thus, the comprehensive circuit configuration for all the contexts can also be automatically generated so as to enhance the generality of the dynamic reconfigurable circuit.

The generation unit 3603 can also generate a circuit configuration that satisfies constraint information on the dynamic reconfigurable circuit. Exemplary constraint information includes the hardware element information 502 illustrated in FIG. 7. Other constraint information may include connection information that should be observed for the inter-cluster networks, and connection information that should be observed for the intra-cluster networks. Automatically generating the circuit configuration that satisfies the constraint information can prevent generation of a circuit configuration that violates constraints. As a result, unnecessary designing can be eliminated, to shorten the design period.

The feasibility determination unit 3605 has the function of determining whether or not the circuit configuration generated by the generation unit 3603 is a feasible configuration, based on the cluster count and the operation device count calculated by the calculation unit 3602. Specifically, for example, the feasibility determination unit 3605 determines whether or not the circuit configuration is feasible, based on whether or not the circuit configuration satisfies the cluster count and the operation device count. This determination processing is performed according to step S1804 in FIG. 18. This operation presents generation of an unfeasible circuit configuration that does not satisfy the cluster count and the operation device count. Therefore, unnecessary designing can be eliminated, to shorten the design period.

In this case, the output unit 3604 outputs the circuit configuration determined as feasible by the feasibility determination unit 3605. On the other hand, the generation unit 3603 may generate a next-state circuit configuration, in which the disposition of the operation devices or the connection of the network modules in the circuit configuration that are determined not to be a feasible configuration by the feasibility determination unit 3605 has been modified to satisfy the cluster count and the operation device count. This generation processing is performed according to the next-state generation processing (step S1805) illustrated in FIGS. 18 and 29. By generating the next-state circuit configuration in this manner, a circuit configuration that is as feasible as possible can be automatically sought.

The feasibility determination unit 3605 may determine for each circuit configuration whether or not the circuit configuration is a feasible configuration based on the constraint information on the dynamic reconfigurable circuit. Specifically, for example, it is determined by checking the PE configuration in the clusters against the hardware element information 502 whether or not constraints such as the numbers of input/output terminals are satisfied. If the constraints are satisfied, the current-state circuit configuration is determined as feasible. This approach prevents generation of an unfeasible circuit configuration that does not satisfy the constraints. Therefore, unnecessary designing can be eliminated, to shorten the design period.

The adoption determination unit 3606 has the function of determining adoption of the next-state circuit configuration by using the annealing method. Specifically, for example, the adoption determination unit 3606 performs steps S2806 to S2812 in next-state generation processing (step S1805) illustrated in FIG. 29. In the annealing method, the adoption probability p decreases as the temperature Ts decreases. Therefore, it is more likely that the next-state circuit configuration is not adopted, and the state settles into the current state. This operation allows a circuit configuration that can be designed as far as possible to be sought. In this case, the output unit 3604 outputs the next-state circuit configuration determined to be adopted by the adoption determination unit 3606.

The feasibility determination unit 3605 may determine whether or not the next-state circuit configuration determined by the adoption determination unit 3606 is a feasible configuration. In this case, the output unit 3604 outputs the next-state circuit configuration as determined to be feasible by the feasibility determination unit 3605. Otherwise, the generation unit 3603 takes, as a current-state circuit configuration, the next-state circuit configuration determined as not a feasible configuration by the feasibility determination unit 3605.

The generation unit 3603 then generates a next-state circuit configuration, in which the disposition of the operation devices or the connection of the network modules in the current-state circuit configuration has been modified to satisfy the cluster count and the operation device count. This generation processing is performed according to the next-state generation processing (step S1805) illustrated in FIGS. 18 and 29. By generating the next-state circuit configuration in this manner, a circuit configuration as feasible as possible can be automatically sought.

The generation unit 3603 may add an operation device to the circuit configuration, based on the difference between the general element configuration file 504 and the calculation result of the calculation unit 3602. Specifically, for example, the operation device type determination unit 3607 determines, based on this difference, the type of operation device to be added. This determination processing is performed according to the generalization processing (step S1509) illustrated in FIG. 15 and FIGS. 33 and 34. The generation unit 3603 then adds the operation device, of the operation device type determined by the operation device type determination unit 3607, to the circuit configuration. This operation allows bringing the PE configuration of each cluster closer to a balanced one, to enhance the generality.

The addition determination unit 3608 has the function of determining, based on a connection state in the circuit configuration, whether or not the operation device of the operation device type determined by the operation device type determination unit 3607 can be added. Specifically, for example, this function is performed according to the procedure in FIG. 34. For example, if a network input/output terminal is available, it is determined that one PE can be added: otherwise, it is determined that no PE can be added.

Thus, as described above, the designing of the dynamic reconfigurable circuit is simplified or automated. This operation allows the designing of the dynamic reconfigurable circuit to be facilitated, and the development period to be shortened.

The design method described can be implemented by executing a prepared program on a computer, such as a personal computer or a workstation. This program may be recorded on a computer-readable recording medium such as a hard disk, flexible disk, CD-ROM, MO, or DVD and read out by the computer from the recording medium to be executed. This program may be incorporated on a medium so as to be distributable over a network, such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of aspects of the invention. Although the variation(s) of the present inventions have been described in detail, it should be understood that the various changes, substitutions, and alterations could be made hereto without departing from the spirit and scope of the invention.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

What is claimed is:

1. A non-transitory computer-readable recording medium that stores therein a computer program for designing a dynamic reconfigurable circuit in which a plurality of circuit configurations are implemented with a single circuit, the computer program enabling a computer to execute:

acquiring a plurality of contexts having connection information between operation devices and network modules, wherein the operation devices and network modules are disposed in clusters, and connection information among the network modules;

calculating, by the computer, a cluster count of the clusters and an operation device count for each operation device type of the operation devices in each cluster based on the acquired plurality of contexts, the calculating being executed for every execution cycle;

generating a circuit configuration for each context in which disposition of the operation devices in each cluster and connection of the network modules are made to satisfy the calculated cluster count and operation device count; and outputting the generated circuit configuration.

2. The non-transitory computer-readable recording medium according to claim 1, wherein the calculating further comprises:

calculating the minimum required number of the operation devices as the operation device count.

3. The non-transitory computer-readable recording medium according to claim 1, wherein the calculating further comprises:

calculating the minimum required number of the clusters as the cluster count.

4. The non-transitory computer-readable recording medium according to claim 1, wherein the generating further comprises:

generating a circuit configuration that comprehensively includes the circuit configurations generated for the respective contexts, and wherein outputting further comprises:

outputting at least any one of the circuit configurations generated for the respective contexts and the circuit configuration that comprehensively includes the respective circuit configurations.

5. The non-transitory computer-readable recording medium according to claim 1, wherein generating further comprises:

generating a circuit configuration that satisfies constraint information on the dynamic reconfigurable circuit.

6. The non-transitory computer-readable recording medium according to claim 5, wherein the computer program further enables the computer to execute:

determining for each circuit configuration whether or not the circuit configuration is a feasible configuration based on the constraint information on the dynamic reconfigurable circuit, wherein generating further comprises:

generating a next-state circuit configuration in which the disposition of the operation devices or the connection of the network modules in the circuit configuration determined as not a feasible configuration has been modified to satisfy the cluster count and the operation device count.

7. The non-transitory computer-readable recording medium according to claim 1, wherein the computer program further enables the computer to execute:

determining feasibility of the circuit configuration is a feasible configuration based on the cluster count and the operation device count, wherein generating further comprises:

generating a next-state circuit configuration in which the disposition of the operation devices or the connection of the network modules in the circuit configuration determined as not a feasible configuration has been modified to satisfy the cluster count and the operation device count.

8. The non-transitory computer-readable recording medium according to claim 7, wherein the computer program further enables the computer to execute:

determining adoption of the next-state circuit configuration by using an annealing method, wherein outputting further comprises:

outputting the determined next-state circuit configuration.

9. The non-transitory computer-readable recording medium according to claim 8, wherein determining feasibility further comprises:

determining feasibility of the determined next-state circuit configuration, and wherein generating further comprises:

taking the next-state circuit configuration as a current-state circuit configuration if it is determined that the next-state circuit configuration is not a feasible configuration, and generating a next-state circuit configuration in which the disposition of the operation devices or the connection of the network modules in the current-state circuit configuration has been modified to satisfy the cluster count and the operation device count.

10. The non-transitory computer-readable recording medium according to claim 7, wherein outputting further comprises:

outputting the circuit configuration determined as feasible.

11. The non-transitory computer-readable recording medium according to claim 7, wherein acquiring further comprises:

acquiring a general element configuration file in which the cluster count of the clusters and the operation device count for each operation device type in each cluster are preset, and wherein generating further comprises:

adding an operation device to the circuit configuration based on a difference between the cluster count and the operation device count in the general element configuration file and the calculated cluster count and operation device count.

12. The non-transitory computer-readable recording medium according to claim 11, wherein the computer program further enables the computer to execute:

determining, based on the difference, a type of the operation device to be added, wherein generating further comprises:

adding the operation device of the operation device type to the circuit configuration.

13. The non-transitory computer-readable recording medium according to claim 12, wherein the computer program further enables the computer to execute:

determining based on a connection state in the circuit configuration whether or not the operation device of the determined operation device type can be added, wherein the generating further comprises adding the operation device of the determined operation device type to the circuit configuration if it is determined that the operation device can be added.

14. A design apparatus for designing a dynamic reconfigurable circuit in which a plurality of circuit configurations are implemented with a single circuit, comprising:
- an acquisition unit for acquiring a plurality of contexts having connection information between operation devices and network modules, wherein the operation devices and network modules are disposed in clusters, and connection information among the network modules;
- a calculation unit for calculating, for every execution cycle, a cluster count of the clusters and an operation device count for each operation device type of the operation devices in each cluster based on the plurality of contexts acquired by the acquisition unit;
- a generation unit for generating a circuit configuration for each context in which disposition of the operation devices in each cluster and connection of the network modules are made to satisfy the cluster count and the operation device count calculated by the calculation unit; and
- an output unit for outputting the circuit configuration generated by the generation unit.

15. A method for designing a dynamic reconfigurable circuit in which a plurality of circuit configurations are implemented with a single circuit, the method enabling a computer to execute:
- acquiring a plurality of contexts having connection information between operation devices and network modules, wherein the operation devices and network modules are disposed in clusters, and connection information among the network modules;
- calculating, by the computer, a cluster count of the clusters and an operation device count for each operation device type of the operation devices in each cluster based on the acquired plurality of contexts, the calculating being executed for every execution cycle;
- generating a circuit configuration for each context in which disposition of the operation devices in each cluster and connection of the network modules are made to satisfy the cluster count and the operation device count calculated by the calculating; and
- outputting the generated circuit configuration.

* * * * *

UNITED STATES PATENT AND TRADEMARK OFFICE
CERTIFICATE OF CORRECTION

PATENT NO. : 8,234,613 B2  
APPLICATION NO. : 12/497022  
DATED : July 31, 2012  
INVENTOR(S) : Tsuguchika Tabaru Page 1 of 1

It is certified that error appears in the above-identified patent and that said Letters Patent is hereby corrected as shown below:

On the Title Page, Item (54) and in the Specification, Column 1, correct the Title to read as follows:

-- DESIGN PROGRAM, DESIGN APPARATUS, AND DESIGN METHOD FOR DYNAMIC RECONFIGURABLE CIRCUIT --

Signed and Sealed this  
Thirteenth Day of August, 2013

Teresa Stanek Rea  
*Acting Director of the United States Patent and Trademark Office*